United States Patent

Tsuyama et al.

[11] Patent Number: 5,915,757
[45] Date of Patent: Jun. 29, 1999

[54] ELECTROSTATIC PROTECTIVE DEVICE AND METHOD FOR FABRICATING SAME

[75] Inventors: Kouichi Tsuyama, Ibaraki-ken; Atsushi Suzunaga, Tochigi-ken; Atsushi Nishimura; Tadashi Isono, both of Ibaraki-ken, all of Japan

[73] Assignee: Hitachi Chemical Company, Ltd., Japan

[21] Appl. No.: 08/900,579

[22] Filed: Jul. 25, 1997

Related U.S. Application Data

[62] Division of application No. 08/632,158, Apr. 15, 1996, Pat. No. 5,714,794.

[30] Foreign Application Priority Data

| Apr. 18, 1995 | [JP] | Japan | 7-92519 |
| Apr. 18, 1995 | [JP] | Japan | 7-92520 |
| Apr. 18, 1995 | [JP] | Japan | 7-92521 |
| Sep. 13, 1995 | [JP] | Japan | 7-235297 |
| Sep. 13, 1995 | [JP] | Japan | 7-235298 |

[51] Int. Cl.$^6$ .................................................... H01K 3/10
[52] U.S. Cl. .......................... 29/852; 29/426.7; 29/830; 257/522; 257/713
[58] Field of Search .................. 29/832, 825, 426.1, 29/426.4, 411, 852, 830; 257/522, 713

[56] References Cited

U.S. PATENT DOCUMENTS

| 3,436,601 | 4/1969 | Dyre . | |
| 4,181,913 | 1/1980 | Thornburg . | |
| 4,250,616 | 2/1981 | Klimeh et al. | 29/830 |
| 4,372,046 | 2/1983 | Suzuki | 29/852 |
| 4,446,168 | 5/1984 | Kato et al. . | |
| 4,821,007 | 4/1989 | Fields et al. | 29/846 X |
| 5,727,310 | 3/1998 | Casson et al. . | |

FOREIGN PATENT DOCUMENTS

| 0 198 624 | 10/1986 | European Pat. Off. . |
| 0 269 224 | 6/1988 | European Pat. Off. . |
| 1566130 | 5/1969 | France . |
| WO90/00826 | 1/1990 | WIPO . |

OTHER PUBLICATIONS

W. den Boer, "Threshold switching in Hydrogenated Amorphous Silicon," Appl. Phys. Letter 40(9):812–813 (May 1, 1982).

*Primary Examiner*—Carl J. Arbes
*Attorney, Agent, or Firm*—Dickstein Shapiro Morin & Oshinsky LLP

[57] ABSTRACT

Provided is an electrostatic protective device which is highly effective in protecting relatively vulnerable devices such as IC's and LSI's from electrostatic damages, and a method for fabricating an electrostatic protective device which can simplify the structure as compared with the conventional devices sealed in a glass container, and can reduce the size and cost of the device. The chip type electrostatic protective device comprises an inner insulating layer made of organic resin material and provided with a plurality of holes for defining air gaps, a pair of outer insulating layers placed on both sides of the inner insulating layer, and circuit segments defining a discharge gap in each of the air gaps. Holes for interconnection are formed in the laminated assembly, and the interior of each of the holes is turned electroconductive. The assembly is then cut apart into individual chip type electrostatic protective devices by cutting through each of the holes for interconnection so as to define terminals for interconnection.

20 Claims, 15 Drawing Sheets

RELATIONSHIP BETWEEN THE GAP SIZE AND THE SPARK VOLTAGE

METHOD OF MEASURING THE EFFECTIVENESS OF ELECTROSTATIC PROTECTION

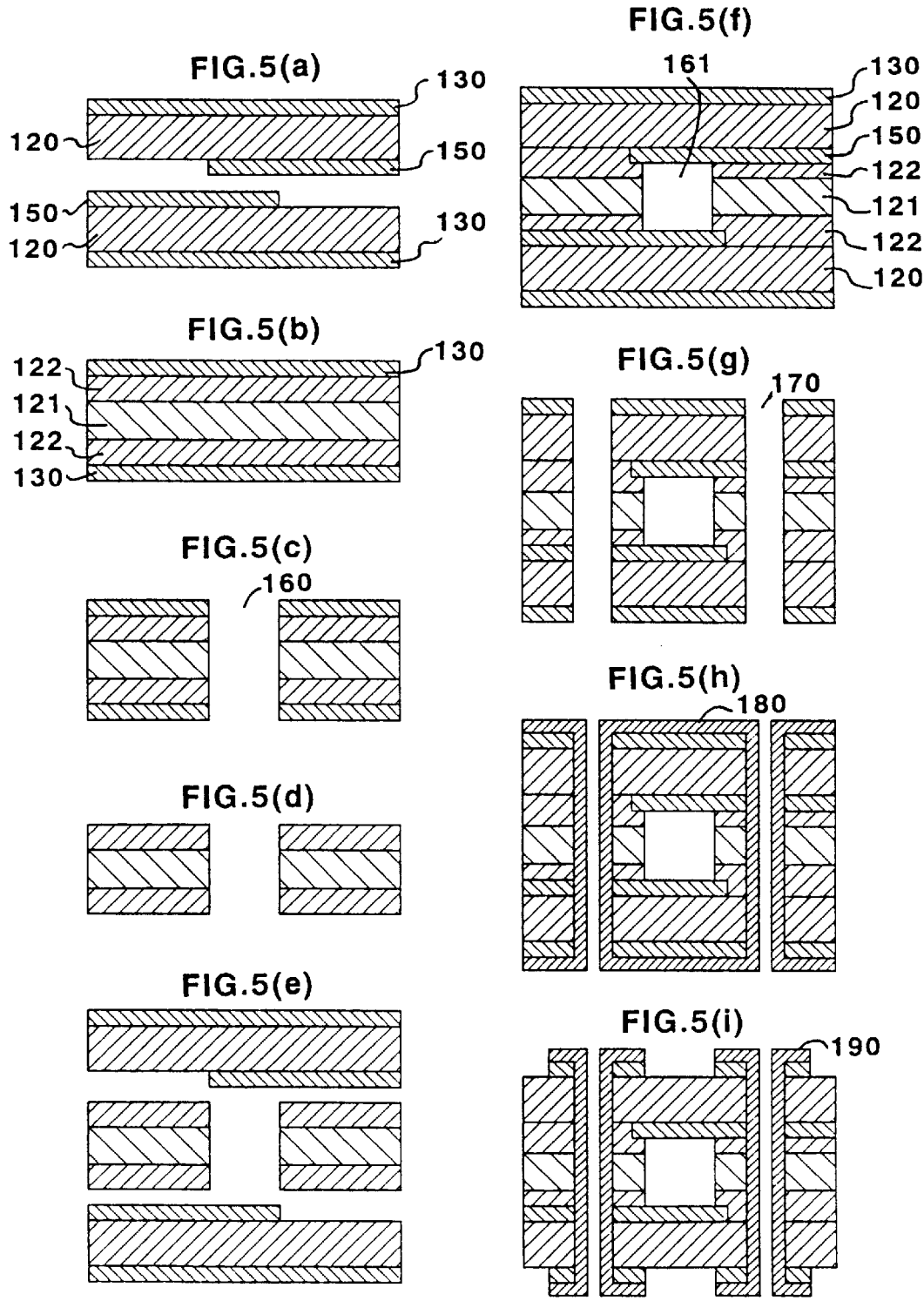

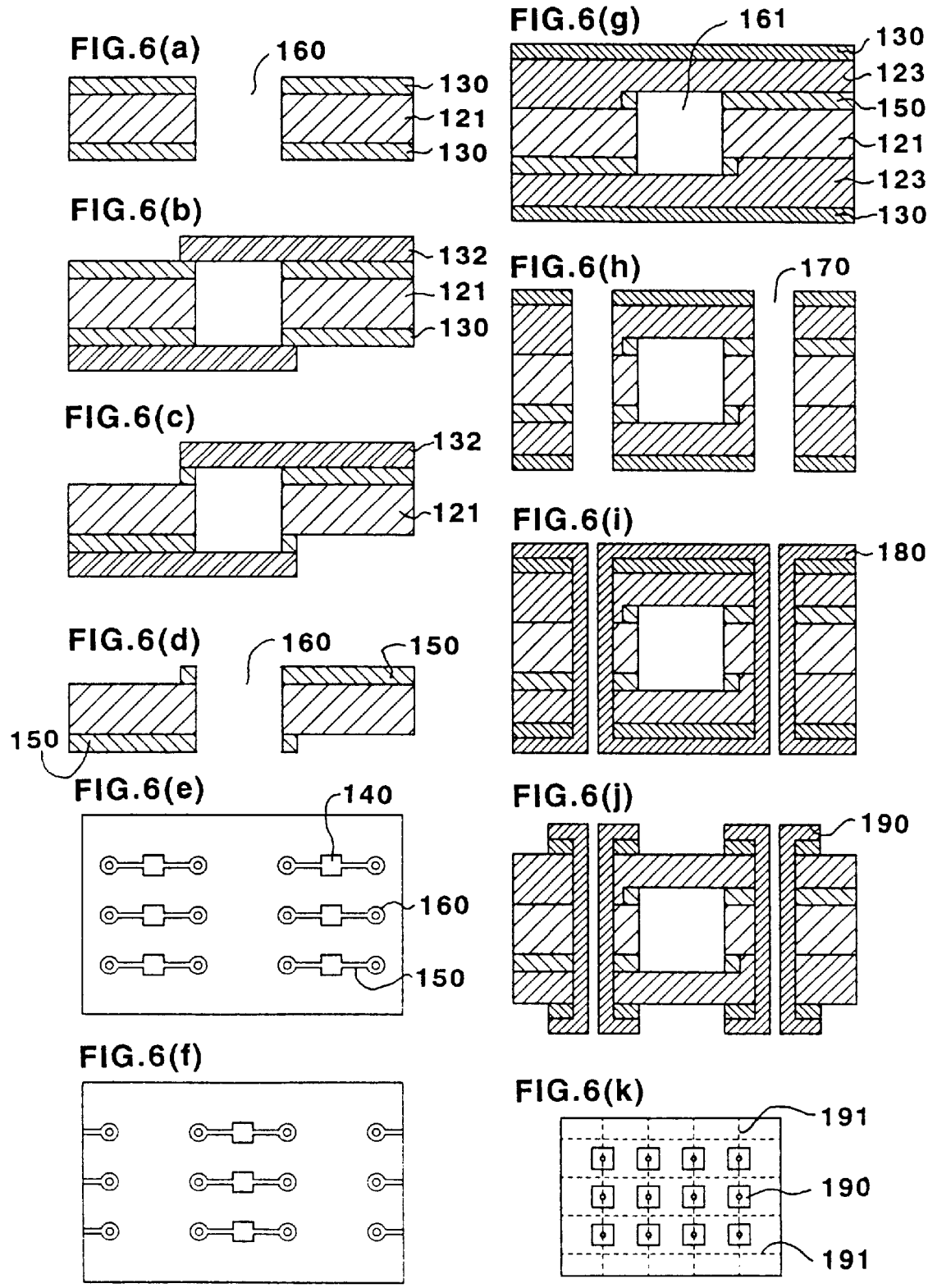

FIG.11(a)
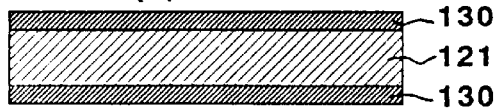
FIG.11(b)
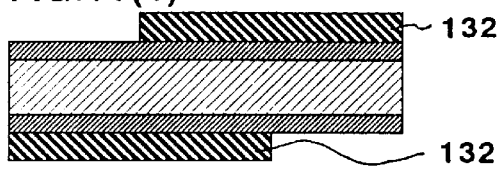
FIG.11(c)
FIG.11(d)
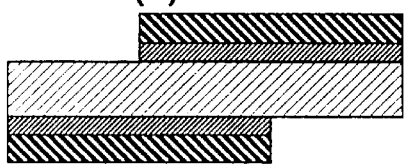
FIG.11(e)
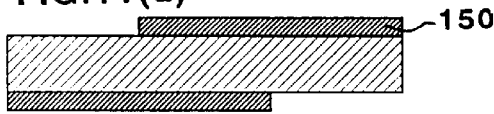
FIG.11(f)
FIG.11(g)
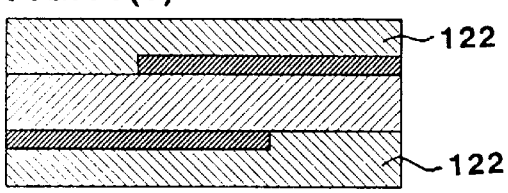
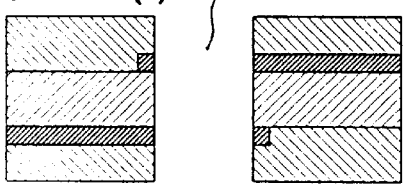
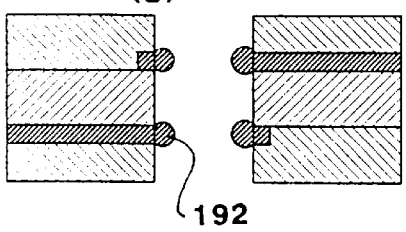
FIG.11(h)
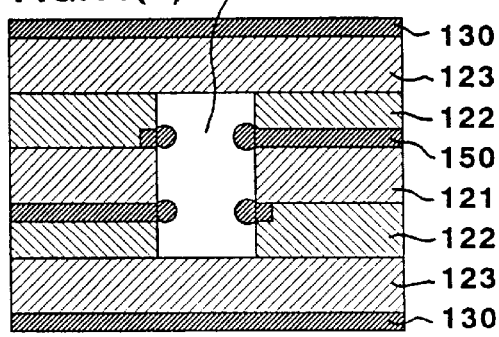
FIG.11(i)
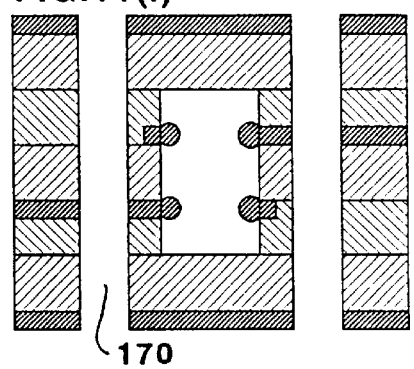
FIG.11(j)
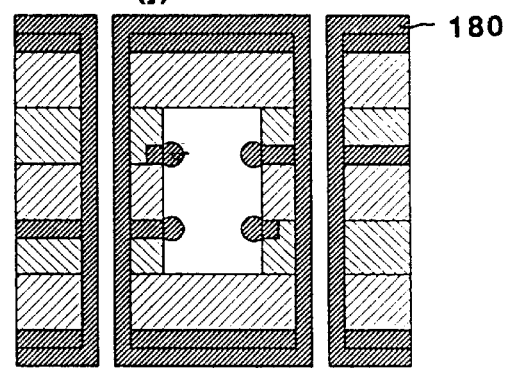
FIG.11(k)
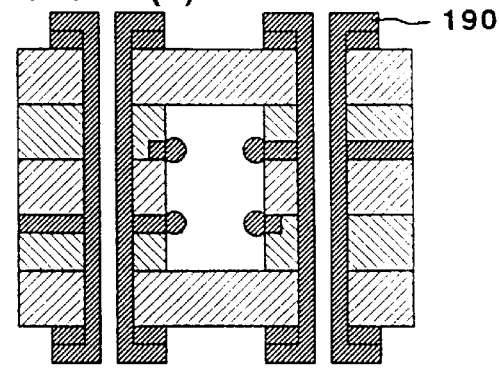

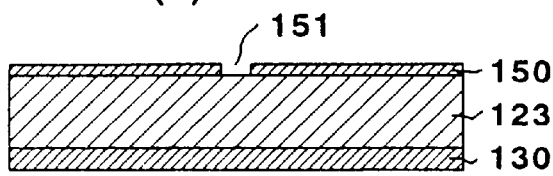
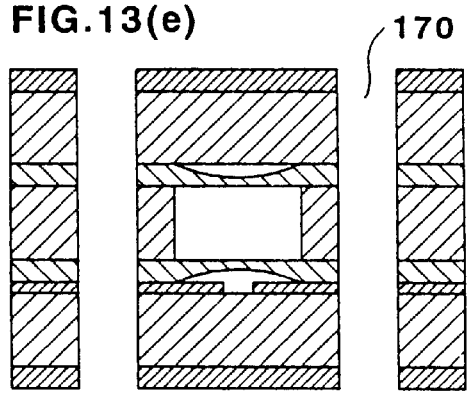
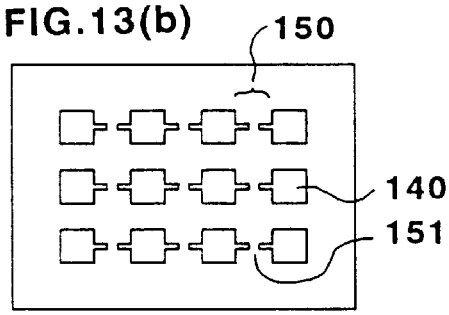
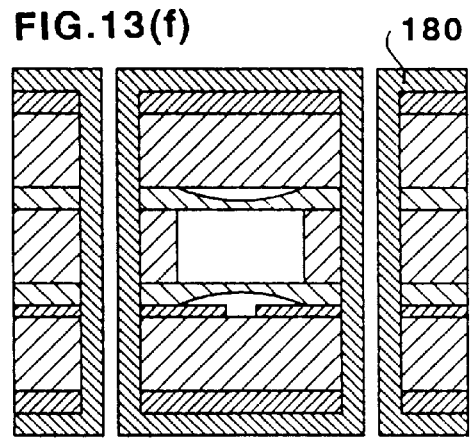
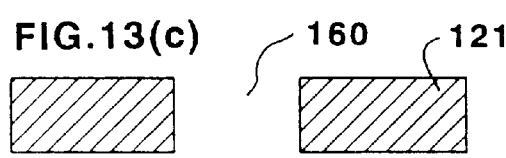
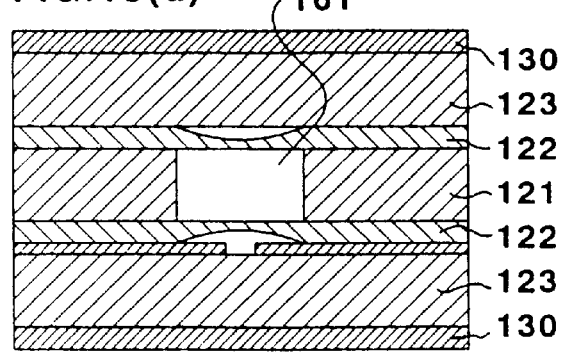
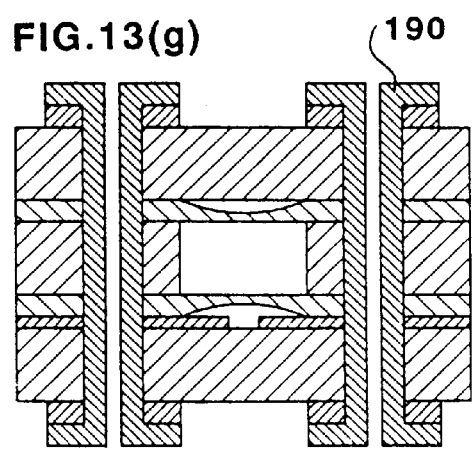

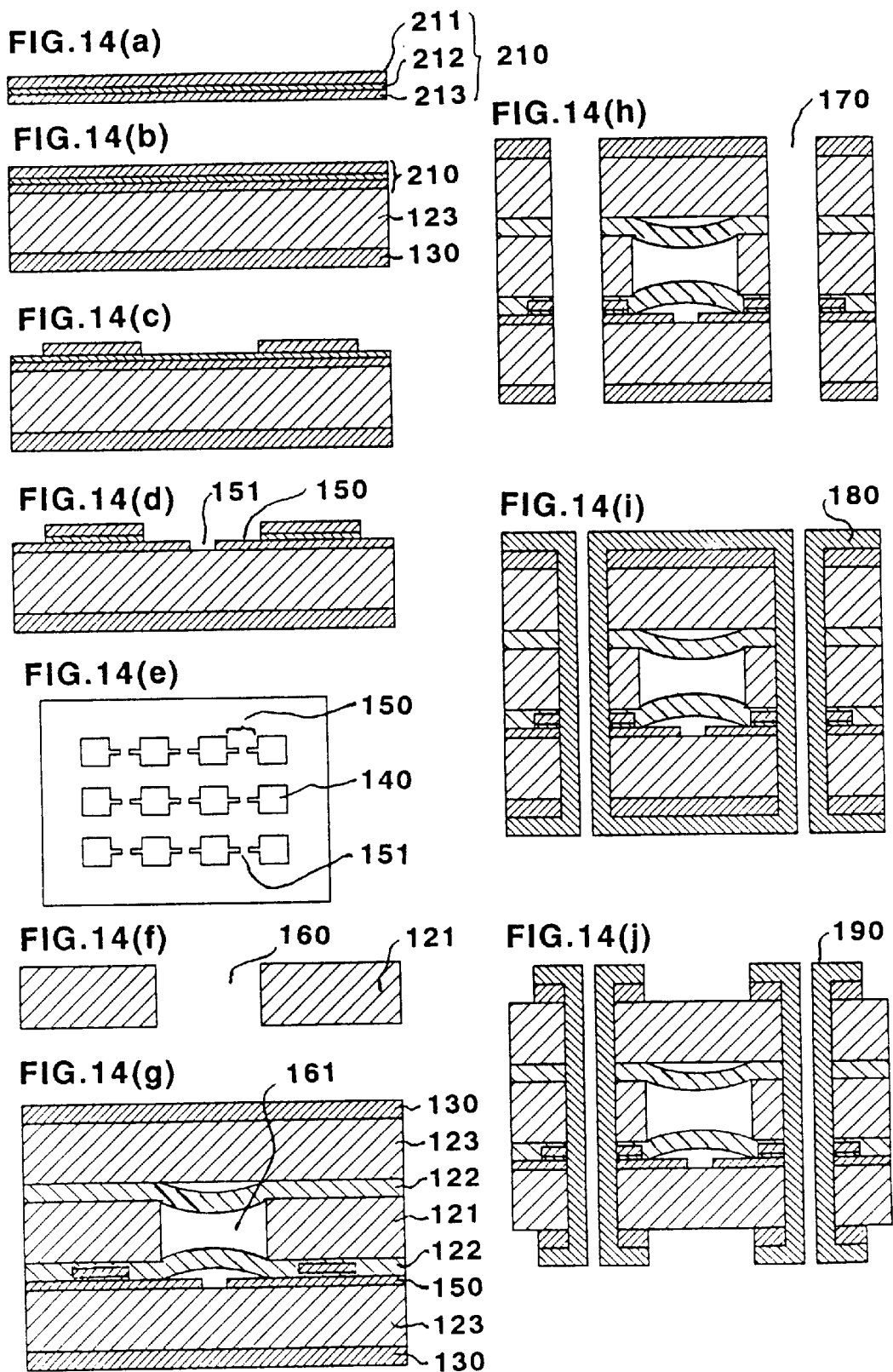

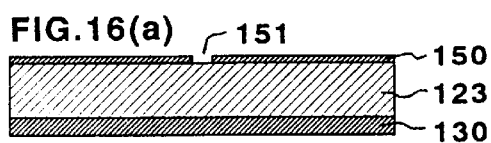
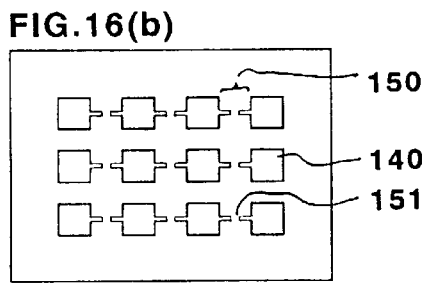
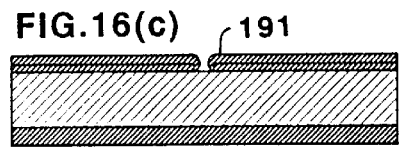
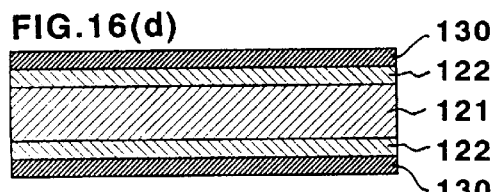
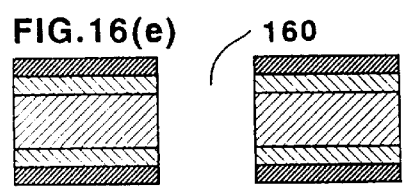
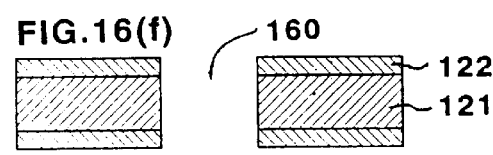
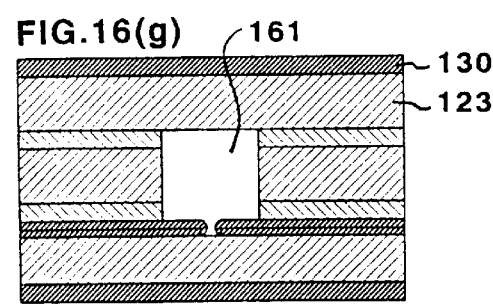
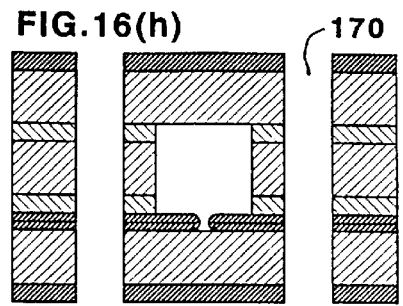
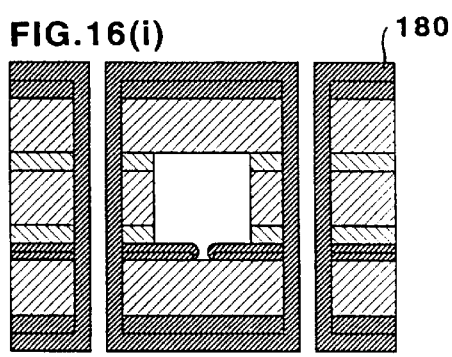
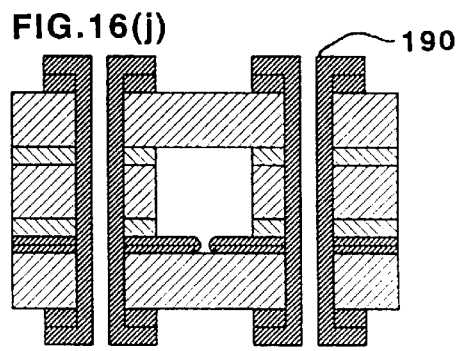
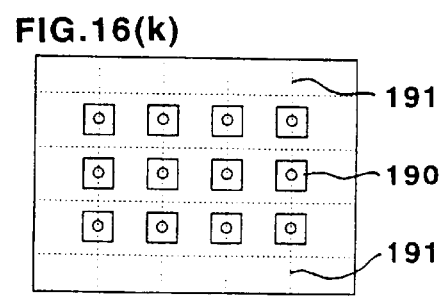

5,915,757

ELECTROSTATIC PROTECTIVE DEVICE AND METHOD FOR FABRICATING SAME

This application is a division of application Ser. No. 08/632,158 filed Apr. 15, 1996 which application is now: U.S. Pat. No. 5,714,794.

TECHNICAL FIELD

The present invention relates to an electrostatic protective chip device having a gap for electric discharge and based on the technology for fabricating circuit boards, and a method for fabricating the same.

BACKGROUND OF THE INVENTION

An electrostatic protective device is used for protecting electronic equipment from electrostatic damages. More specifically, the term "electrostatic protective device" as used in this specification means a device which is connected in parallel with an IC or an LSI that is to be protected, and remains as an electrical insulator under normal condition (in absence of electrostatic pulses) so as not to affect the circuit, but becomes electrically conductive when electrostatic pulses are applied thereto (S1 in FIG. 4 is on) so as to protect electronic devices such as IC's and LSI's from electrostatic damages.

The devices used for protecting IC's and LSI's from electrostatic damages include varistors, zener diodes, and discharge gap devices, and these different protective devices are selected for different applications. Varistors and zener diodes are known to involve high levels of current leakage. In the case of zener diodes, as they have a polarity, it is necessary to connect two of them in opposite directions in parallel with each other for applications where the electric current can flow in both directions, and the cost is therefore relatively high.

On the other hand, discharge type devices involve virtually no leakage current, and are simple in structure, hence less prone to failures. The discharge voltage can be adjusted by changing the discharge gap, and in the case of a sealed structure, by changing the pressure of the sealed gas and the kind of the sealed gas.

Some of the commercially available devices, for instance the one sold under the tradename of "Dia Surge Protector" by Mitsubishi Material, use a cylindrical ceramic block covered by an electroconductive film. The discharge gap is formed in this film by cutting it with laser, and the entire assembly is sealed inside a glass container.

According to those disclosed in Japanese patent laid-open (kokai) publications Nos. 2-223182, 3-89588, 3-261086, 4-22086 and 5-67851, the discharge gap is formed directly on a printed circuit board.

The discharge gap type devices sealed in containers, which are commercially available, have favorable properties, but are relatively large in size due to their complex structures. It is highly difficult to reduce the size of a discharge gap type device to a level suitable for a small device for surface mount or for a chip device, i.e., to 1 to 2 mm in width, 2 to 4 mm in length, and 1 to 2 mm in size. Furthermore, the need for a large number of different materials for its fabrication is expected to work against the effort to reduce the cost.

Those disclosed in Japanese patent laid-open (kokai) publications Nos. 2-223182, 3-89588, 3-261086, 4-22086 and 5-67851 are based on the concept of forming a discharge gap directly on the printed circuit board. According to the normal method of fabrication, the possible size of the gap is no less than 150 $\mu$m, and the dimensional tolerance thereof is typically in the range of ±20 to 30 $\mu$m. As a matter of fact, the dimension of the discharge gap is given as a few millimeters in Japanese patent laid-open publication No. 2-223182, as 4 mm in Japanese patent laid-open publication No. 2-89588, as 0.5 mm in Japanese patent laid-open publication No. 3-261086, and as 0.15 mm in Japanese patent laid-open publication No. 5-678518. With the size of the discharge gap in such a range, the discharge voltage is so high that the effectiveness of these devices is quite limited, and these devices are not suitable for the protection of IC's and LSI's which are highly vulnerable to electrostatic damages. Presumably, the devices proposed in these Japanese patent publications are intended for electronic equipment involving higher voltage levels than IC's as opposed to the aim of the present invention. Thus, it can be concluded that there have been no prior art which has successfully accomplished the task of the present invention by using the technology of fabricating printed circuit boards.

The relationship betwee ne discharge gap sizes and the actual discharge voltage levels is discussed in the following.

FIG. 3 shows the relationship between the discharge voltage (spark voltage) and the gap between a pair of parallel electrodes. (The graph is based on the equations given in page 221 of "Electrostatic Handbook", edited by Electrostatic Association of Japan, published by Ohm, Jun. 20, 1988.) Even in the case of the discharge gap of 0.15 mm or the smallest discharge gap of all those discussed in the prior Japanese patent publications, FIG. 3 indicates that the discharge voltage between the parallel electrodes will be approximately 1.5 kV. In the case of projection type electrodes, the discharge voltage would be 10 to 20% less than this level, but it still would not be sufficient to protect IC's and LSI's. The lack of precision in the size of the gap also makes the previous proposals unsuitable for the object of the present invention.

The previous proposals also did not address the problem of protecting the discharge gap from environmental effects, but without proper protection from environmental effects, the discharge voltage may change due to the contamination of the surface of the electroconductive elements with the moisture and gases that may be present in the environment. If the discharge gap is coated with resist or the like for its protection, it will fill into the gap, and a substantial change in the discharge voltage will result. Even if the gap were successfully reduced to a sufficiently small level for a satisfactory protective action to be achieved even when the gap is filled with resist (this however is a highly unrealistic assumption because the gap is required to be less than 1 to 2 $\mu$m for the gap to demonstrate a desired protective effectiveness), there still remains the problem that the resist filling the gap may be affected by the electric discharges, and the reduction in the electric resistance or even the conductance of the gap can occur.

BRIEF SUMMARY OF THE INVENTION

In view of such problems of the prior art, a primary object of the present invention is to provide an electrostatic protective device which is highly effective in protecting relatively vulnerable devices such as IC's and LSI's from electrostatic damages.

A second object of the present invention is to provide an electrostatic protective device which is suitable for mass production, and cost little for production.

A third object of the present invention is to provide an electrostatic protective device which allows its discharge voltage to be controlled at a high precision.

A fourth object of the present invention is to provide an electrostatic protective device which is durable in use.

A fifth object of the present invention is to provide an electrostatic protective device which involves virtually no current leakage.

A sixth object of the present invention is to provide an electrostatic protective device which is suitable for compact design, and in particular suited to be fabricated as a surface mount device or a chip device.

A seventh object of the present invention is to provide a method suitable for fabricating an electrostatic protective device according to the present invention.

These and other objects of the present invention can be accomplished by providing a chip type electrostatic protective device, comprising: an inner 6 insulating layer provided with a through hole for defining an air gap; a pair of circuit segments attached to at least one side of the inner insulating layer, the circuit segments defining an air gap therebetween in the air gap hole; a pair of outer insulating layer placed one on each side of the inner insulating layer so as to enclose the air gap hole in an air tight condition; and a pair of terminals formed along either side end of the inner insulating layer each for interconnection with an associated one of the circuit segments.

The present invention having a pair of electrostatic protective device circuit segments incorporated in an insulating base board features a substantially more simple structure than the conventional device which is encapsulated in a glass container. Therefore, the present invention allows the device to be made at a lower cost. Because the air gap is enclosed inside a laminated assembly, and the discharge segment is isolated from the exterior, the device can be made highly resistant against environmental influences. Typically, the terminals for interconnection are each formed by a layer of plating formed along corresponding side end of an assembly including the inner insulating layer, one of the circuit segments, and the outer insulating layers.

In particular, by using a fluoride resin or a polyimide resin for the material surrounding the discharge gap, degradation of the device by electric discharges can be minimized, and the stability of the device can be improved. In case of a fluoride resin material, it may be selected from a group consisting of polytetrafluoroethylene resin, ethylene/tetrafluoroethylene copolymer, tetrafluoroethylene/hexafluoropropylene copolymer, tetrafluoroethylene/perfluoroalkoxypropylene copolymer, and a modified resin prepared by modifying a fluoride resin with a different organic resin. Because these resin materials are highly resistant to heat, degradation of the resin material defining the discharge gaps can be avoided, and any undesirable continual conduction of electric current can be therefore avoided. Thus, the safety of the device can be also improved as compared with the case in which a normal resin material is used for the discharge gap.

The metallic material for forming the electrostatic protective device is selected according to the electroconductivity, corrosion resistance and ease to be patterned, and, not exclusively, may consist of copper, nickel, gold, silver, aluminum or an alloy of these metals.

According to a preferred embodiment of the present invention, the circuit segments are each interposed between the inner insulating layer and an associated one of the outer insulating layer. The two axial ends of the air gap hole may be substantially closed by the respectively circuit segments. In this case, the size of the discharge gap separating the circuit segment layers is highly critical, and should be in the range of 15 to 60 $\mu$m for the protection of normal electronic devices. When the size of the discharge gap is reduced to less than 15 $\mu$m, the control of the size becomes highly difficult, and the difficulty involved in the fabrication process increases. For the protection of normal IC's and LSI's, the range of 15 to 60 $\mu$m is sufficient as the discharge gap. For the protection of more vulnerable IC's and LSI's, the discharge gap should be in the range of 15 to 30 $\mu$m. In applications where only those electrostatic pulses of significantly high voltage levels are required to be removed, the size of the discharge gap may be increased to about 150 $\mu$m. If the size of the discharge gap is increased beyond this level, the discharge voltage will become so high that the device will cease to be useful for the object of the present invention, or for the protection of electronic devices and electronic equipment.

It is also possible that the two axial ends of the air gap hole are closed by the respectively outer insulating layers, and the air gap hole is passed through the circuit segments. In this case, the size of the discharge gap can be reduced to approximately 5 $\mu$m without losing the control of the size or without unduly increasing the difficulty involved in the fabrication process.

The overall thickness of the electrostatic protective device segments is only required to be sufficient to conduct instantaneous electric current, and may be in the order of 1 $\mu$m in the case of gas phase plating, and in the range of 5 to 70 $\mu$m in the case of liquid phase plating and metallic foil, in view of the ease of fabrication and cost although it is by no means restrictive.

The structure of the electrostatic protective device according to the present invention may take any one of a large number of possible forms. For instance, it is effective to use thin resin film for the inner insulation layer defining the discharge gap layer and lower the discharge voltage to effectively protect those electronic devices which are relatively vulnerable to electrostatic damages. If the size of the discharge gap separated by the inner insulating layer is relatively large, the inner insulating layer may consist of either reinforced resin material or resin film. At least the material for the part which defines the discharge gap desirably consists of a fluoride resin material or a polyimide resin material as they are relatively less prone to degradation.

The fluoride resin material may consist of a member selected from a group consisting of polytetrafluoroethylene resin, ethylene/tetrafluoroethylene copolymer, tetrafluoroethylene/hexafluoropropylene copolymer, tetrafluoroethylene/perfluoroalkoxypropylene copolymer, and a modified resin prepared by modifying a fluoride resin with a different organic resin. In terms of cost, polytetrafluoroethylene is relatively inexpensive, and is therefore favorable. Tetrafluoroethylene/perfluoroalkoxypropylene copolymer is preferred because of a relatively low molding temperature, and ethylene/tetrafluoroethylene copolymer involves an even lower molding temperature.

If polyimide resin material is selected, it may be either used alone after being given with an adhesive property by being modified or in combination with an adhesive layer made of a fluoride or polyimide resin having a durable adhesive property. There are a large number of such possible combinations without departing from the inventive concept of the present invention. In the latter case, affinity to a bonding agent can be improved by applying plasma, corona or short wave ultraviolet radiation to the surface of the polyimide resin material. However, these processes are optionally selected according to each particular application, and should not be considered as limiting the present invention.

The use of reinforced resin material for a part of or all of the structural materials of the electrostatic protective device is again purely optional, and should be selected according to the required mechanical strength, the object and the cost. The materials that may be selected for reinforcing resin material include glass cloth, glass paper and so on.

To avoid the insulating material, which is laminated in a step following formation of holes for defining air gaps, from flowing into the holes for defining air gaps, it is advantageous to etch the electroconductive layers to form the electrostatic protective device segments before drilling the holes, to laminate and bond insulating material (surface layers) for increasing the size of the air gaps, and, then, to drill the holes for defining air gaps. Thus, because the distance between the open end of each hole for defining an air gap and the circuit segment layer for defining a discharge gap is increased, even when a small amount of insulating material should get into the holes during the laminating and bonding step, it is less likely for the insulating material to attach to or deposit on an inner surface of the circuit segment layer for defining a discharge gap. The thickness of the insulating material (surface layers) for increasing the size of the air gaps can be freely selected, but preferably less than 50 $\mu$m and greater than 500 $\mu$m in view of the ease of fabrication, cost and the size of the product.

The electroconductive layers can be formed by placing metallic foil layer, or by applying gas phase or liquid phase plating directly on the base board.

According to another preferred embodiment of the present invention, the circuit segments are both interposed between the inner insulating layer and one of the outer insulating layer with mutually opposing edges of the circuit segments being located in the air gap hole. Preferably, each of the circuit segments has a size ranging from 3 to 10 $\mu$m.

In view of the object of the present invention, the size of the discharge gap separating the segment layers is highly critical, and should be in the range of 15 to 60 $\mu$m for the protection of normal electronic devices. When the size of the discharge gap is reduced to less than 15 $\mu$m, the control of the size becomes highly difficult, and the difficulty involved in the fabrication process increases. For the protection of normal IC's and LSI's, the range of 15 to 60 $\mu$m is sufficient as the discharge gap. For the protection of more vulnerable IC's and LSI's, the discharge gap should be in the range of 15 to 30 $\mu$m. In applications where only those electrostatic pulses of significantly high voltage levels are required to be removed, the size of the discharge gap may be increased to about 150 $\mu$m. If the size of the discharge gap is increased beyond this level, the discharge voltage will become so high that the device will cease to be useful for the object of the present invention, or for the protection of electronic devices and electronic equipment.

The inventors have found that the method of etching metallic foil having a thickness less than 10 $\mu$m is effective in forming such extremely small discharge gaps at a high precision and at a low cost.

The minimum thickness of the electroconductive layer of the electrostatic protective device circuit segments is only required to be sufficient to conduct instantaneous electric current. Therefore, the thickness may be extremely thin, and may be determined in view of the ease of fabrication and cost. As a practical matter, if the thickness of the electrostatic protective device circuit segments is no more than 3 $\mu$m, the controlling the precision of the thickness becomes highly difficult, and pin holes could develop. If the thickness is greater than 10 $\mu$m, the precision in forming the discharge gaps is reduced, and it becomes difficult to produce uniform results.

The metallic foil that may be used on an insulating layer for forming the circuit segments includes extremely thin copper foil, extremely thin copper foil combined with an aluminum carrier, and the composite foil of copper (carrier), nickel alloy (stopper) and copper (extremely thin foil) disclosed in Japanese patent laid open publication No. 4-217815.

If polyimide resin material is selected, the resin material is preferably directly attached to the copper foil without the intervention of any bonding agent. Modified polyimide is also acceptable although there may be a slight reduction in performance.

A part of each of the circuit segments connected to an associated one of the terminals for interconnection may be provided with a thickness ranging from 10 to 50 $\mu$m while the thickness of the remaining part of the metallic layer is in the range of 3 to 10 $\mu$m. By doing so, the terminal segments for interconnection are reinforced, and the reliability of the chip type electrostatic protective device against temperature changes can be improved.

More specifically, the thermal stress which may be caused by the change in temperature due to the changes in the ambient temperature tends to be concentrated in the region of the electrostatic protective device circuit segments connecting with the holes for interconnection. Increasing the thickness of the related part of the circuit segments is therefore effective in improving the reliability of the electric connection between these parts. The thickness is desired to be large, but an excessive thickness causes problems with the fabrication process (an increase in the work time, an increase in the material, and changes in the laminating conditions due to the reduction in the capability of the resin material to accommodate the thickness). Also, the advantage gained by an increased thickness diminishes as the thickness is increased beyond a certain level. Based on these considerations, the thickness is preferred to be in the range of 10 to 50 $\mu$m.

The bonding between the insulating material provided with holes for defining air gaps and other elements can be accomplished either by selecting a material having an adhesive property suitable for the subsequent steps for the insulating material provided with holes for defining air gaps, or covering the insulating material without any adhesive property with a material having a lower softening point. It is also possible to interpose resin film having a thickness in the range of 5 to 30 $\mu$m, more preferably in the range of 5 to 15 $\mu$m, and a softening point lower than that of the insulating material provided with holes between the insulating material provided with holes and other elements.

The two methods can be combined. More specifically, it is also possible to cover the surface of the insulating material provided with holes with material having a lower softening point, and interpose resin film for laminating and bonding.

In this case, the preferred range of thickness will be given as a combined thickness of the material having a lower softening point and covering the insulating material provided with holes, and the resin film. When the resin film is interposed, it will cover the electrostatic protective device circuit segments, and serves as a protective layer for covering the electrostatic protective device circuit segments.

In these cases, the kind of the resin film, the laminating conditions, and the size and shape of the discharge gaps must be appropriately selected so that the thermally softened resin would not be filled into the discharge gaps.

In the laminating and bonding step, the insulating materials other than those for bonding purpose may consist of polytetrafluoroethylene, and those for bonding purpose may consist of tetrafluoroethylene/ethylene copolymer resin which has a lower softening point than polytetrafluoroethylene. By selecting such a combination, because materials having a lower softening point than the resin material supporting the electrostatic protective device circuit segments, the bonding temperature can be lowered, and the thermal distortion of the electrostatic protective device circuit segments can be thereby reduced.

It is known that environmental substances such as moisture, sulfur dioxide gas can seep through the base board, and corrode the electrostatic protective device circuit segments. If such a condition occurs, the discharge voltage changes in time, and the properties of the device can substantially vary, making the device unsuitable for applications requiring a high precision.

When the device is used in applications where a high precision is required or the device has to be used in a highly adverse environment, the method involving the use of interposed resin film is effective, presumably because there is no laterally extending reinforcing member which is exposed to the air gaps, and the diffusion of environmental substances from the interfaces of such an reinforcing member can be avoided.

Covering the surface of the electrostatic protective device circuit segments with a protective layer could cause the clogging of the discharge gap portions, but because the related portions are not subjected to any pressure, it is possible to avoid the clogging of the discharge gap portions by using resin film demonstrating a high viscosity at high temperature and by appropriately selecting the bonding condition. The thickness of the protective layer is preferably no more than 30 $\mu$m, more preferably no more than 15 $\mu$m. The lower limit of the thickness of the film is determined by the lower limit imposed by the available fabrication technique, handling, and the possibility of creating pin holes, and is typically about 5 $\mu$m. If a protective layer is to be used or not, and what should be the thickness of the protective layer can be determined by taking into account the specifications, properties and operating environments of the contemplated electrostatic protective device.

Using such a thin protective layer alone may not provide a sufficient mechanical strength, and a desired result may not be obtained due to abrasion with other elements. However, according to the present invention, because the electrostatic protective device circuit segment is enclosed in an air gap defined inside an insulating base board, the protective film is not required to have any substantial mechanical strength. It suffices if environmental substances are kept off from the electrostatic protective device circuit segment, and a thin protective film is sufficient for such a purpose.

When the circuit segments are each interposed between the inner insulating layer and an associated one of the outer insulating layer, and two axial ends of the air gap hole are either substantially closed by the respectively circuit segments or passed through the circuit segments, parts of the circuit segments coated with the plating layer and situated in the air gap hole may project from an inner wall surface of the air gap hole by a height ranging from 5 to 100 $\mu$m. Thus, the discharge gap is defined by plating the end surfaces of the lands projecting from the upper and lower surfaces of the inner insulating layer, and making them project, and the size of the discharge gap can be controlled at a high precision. The electric discharge between the projecting plated members consists of aerial discharge, and the degradation of the material surfaces due to repeated electric discharges can be virtually eliminated.

In case of the electrostatic protective device in which the circuit segments are both interposed between the inner insulating layer and one of the outer insulating layer with mutually opposing edges of the circuit segments being located in the air gap hole, each of the circuit segments may be provided with a layer of metallic plating at least at a part thereof adjacent the edge thereof opposing the edge of the other circuit segment. Preferably, a minimum distance between parts of the circuit segments coated with the plating layer and situated in the air gap hole ranges from 5 to 150 $\mu$m.

Because the discharge gaps are first defined by etching and, after ascertaining the size of the gaps, plating is performed on the pattern defining the discharge gaps, the size of the discharge gaps can be controlled at high precision. The same advantage can be achieved also when plating is performed so as to define the discharge gap portions, and the unnecessary part of the electroconductive layer is removed by etching.

Because the size of the gaps on the surface of the electroconductive layer is smaller than that at the interface between the base material and the electroconductive layer by virtue of the presence of the plating, the electric discharge between the projecting plated members consist of aerial discharge, instead of surface discharge, and not only the discharge is prevented from being affected by the surface irregularities of the base material but also the degradation of the material surfaces due to repeated electric discharges can be virtually eliminated.

A method for making a chip type electrostatic protective device according to the present invention may comprise the steps of: preparing a laminated assembly comprising a pair of metallic layers interposing an inner insulating layer therebetween; forming a plurality of through holes for defining air gaps in the laminated assembly; forming circuit segments by selectively removing the metallic layers by etching, each of the circuit segments including a part surrounding one of the air gap holes; laminating and bonding an outer insulating layer and metallic foil to each side of an assembly of the inner insulating layer and the circuit segments; forming through holes for interconnection in an assembly prepared by the preceding step between the air gap holes; forming terminal segments for interconnection around the holes for interconnection by selectively etching the metallic foil; forming an electroconductive layer on an inner wall of the holes for interconnection; and cutting apart an assembly prepared by the preceding step into individual chip type electrostatic protective devices by cutting through each of the holes for interconnection so as to define a terminal for interconnection with a cut apart half of each of the holes for interconnection.

A method for making a chip type electrostatic protective device may also comprise the steps of: preparing a first outer insulating layer having a metallic layer on each side thereof, at least one of the metallic layers having a thickness ranging from 3 to 10 $\mu$m; forming a plurality of circuit segments on the first outer insulating layer by etching away unnecessary parts of the one metallic layer from the first outer insulating layer, each associated pair of the circuit segments being provided with mutually opposing edges in the air gap hole; preparing an inner insulating layer provided with a plurality of holes for defining air gaps; laminating and bonding the inner insulating layer between the first outer insulating layer, and a second outer insulating layer having a metallic layer formed on one side thereof, with the other metallic layer of the first outer insulating layer and the metallic layer formed on one side of the second outer insulating layer facing away from each other; forming through holes for interconnection in an assembly prepared by the preceding step between the air gap holes; forming terminal portions for interconnection around the holes for interconnection by selectively etching the metallic foil; forming an electroconductive layer on an inner wall of the holes for interconnection; and cutting apart an assembly prepared by the preceding step into individual chip type electrostatic protective devices by cutting through each of the holes for interconnection so as to define a terminal for interconnection with a cut apart half of each of the holes for interconnection.

The metallic layers having a thickness ranging from 3 to 10 μm, and formed on the first outer insulating layer may be prepared by the steps of; laminating a composite metallic layer including a first copper layer having a thickness ranging from 10 to 50 μm, an intermediate layer made of nickel or an alloy thereof having a thickness less than 1 μm, and a second copper layer having a thickness ranging from 3 to 10 μm to the first outer insulating layer, with the second copper layer facing the first outer insulating layer; removing the first copper layer; and removing the intermediate layer until the second copper layer is exposed.

The first copper layer is left unremoved in parts adjoining points of connection with the through holes for interconnection. Thereby, a part of each of the circuit segments connected to an associated one of the terminals for interconnection may be provided with a thickness ranging from 10 to 50 μm while the thickness of the remaining part of the metallic layer is in the range of 3 to 10 μm. By doing so, the terminal portions for interconnection are reinforced, and the reliability of the chip type electrostatic protective device against temperature changes can be improved.

For the maximum control of the discharge gap size and the discharge voltage, the method of the present invention may further comprise the step of applying a controlled amount of protective plating to the circuit segments before the laminating and bonding step.

BRIEF DESCRIPTION OF THE DRAWINGS

Now the present invention is described in the following with reference to the appended drawings, in which:

FIGS. 5(a) to 5(i) are sectional views showing different fabrication steps to illustrate the second embodiment of the present invention;

FIGS. 6(a) to 6(k) show different fabrication steps to illustrate the third embodiment of the present invention, (a) to (c) and (g) to (j) being sectional views, (e) and (f) being plan views showing the circuit patterns on the front and reverse surface of the base board at step (d), (k) being a plan view showing how the base board is cut apart into individual devices;

FIGS. 11(a) to 11(j) are sectional views showing different fabrication steps to illustrate the seventh embodiment of the present invention;

FIGS. 13(a) to 13(g) show different fabrication steps to illustrate the ninth embodiment of the present invention, (a) and (c) to (g) being sectional views, (b) being a plan view showing the circuit patterns on the front surface of the base board at step (a);

FIGS. 14(a) to 14(j) show different fabrication steps to illustrate the tenth embodiment of the present invention, (a) to (d) and (f) to (j) being sectional views, (e) being a plan view showing the circuit patterns on the front surface of the base board at step (d);

FIGS. 16(a) to 16(k) show different fabrication steps to illustrate the eleventh embodiment of the present invention, (a) and (c) to (j) being sectional views, (b) being a plan view showing the circuit patterns on the front surface of the base board at step (a), (k) being a plan view showing how the base board is cut apart into individual devices.

DETAILED DESCRIPTION OF THE PREFERRED EMBODIMENTS

Embodiment 1

Figure 1A:
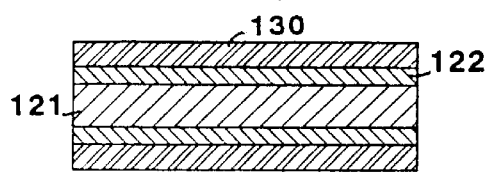
FIGS. 1(a) to 1(l) show different fabrication steps to illustrate the first embodiment of the present invention, (a) to (e) and (h) to (k) being sectional views, (f) and (g) being plan views showing the circuit patterns on the front and reverse surface of the base board at step (e), (l) being a plan view showing how the base board is cut apart into individual devices.

Reference is made to FIGS. 1(a) to 1(l) illustrating different steps of fabricating a first embodiment of the present invention. A metallic layer 130 consisting of copper foil having the thickness of 18 μm was attached to the two sides of an insulating base board as illustrated in FIG. 1(a). This insulating base board was prepared by laminating an inner insulating layer 121 consisting of polyimide film marketed under the tradename of Apical (Kanegahuchi Kagaku Kogyo KK), and a pair of surface layers each consisting of a tetrafluoroethylene/ethylene copolymer sheet marketed under the tradename of Aflex film (Asahi Glass KK) having the thickness of 6 μm and a lower softening point than the inner insulating layer 121, with the copper foil 130 placed on each outer surface of the insulating base board, under the press condition of 280° C. of temperature, 30 minutes of press time, and 20 kg/cm² of press pressure. The Apical film (Kanegahuchi Kagaku Kogyo KK) was available in thicknesses of 7, 5, 12.5, 25, 38, 50, 75 and 125 μm.

Figure 1H:
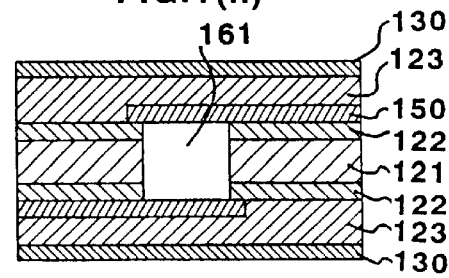
Figure 1B:
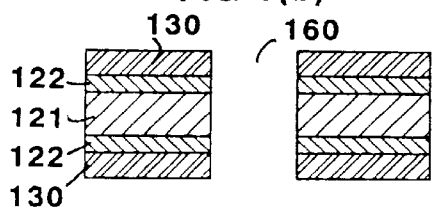

Holes 160 (1.2 mm in diameter) for defining air gaps were drilled in the assembly as illustrated in FIG. 1(b). The presence of copper foil allows such fine holes to be drilled at a required precision. The copper foil was then removed from the two sides of the base board by etching to form the perforated base board consisting of an inner insulating layer 121 and a pair of surface layers 122 as illustrated in FIG. 1(c).

Figure 1I:
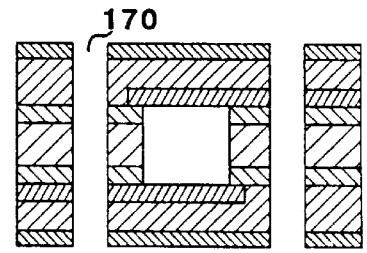
Figure 1C:
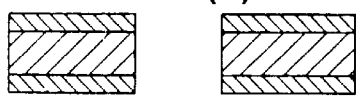
Figure 1D:
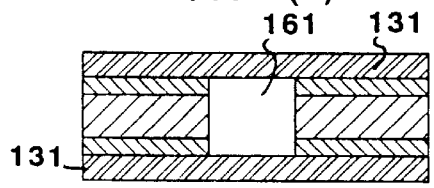
Figure 1J:
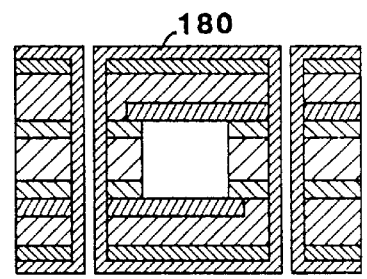
Figure 1E:
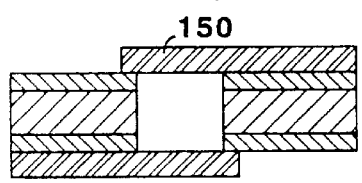
Figure 1F:
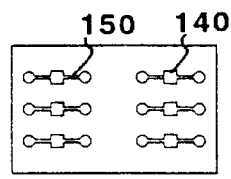
Figure 1G:
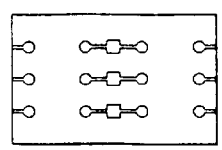
Figure 2:
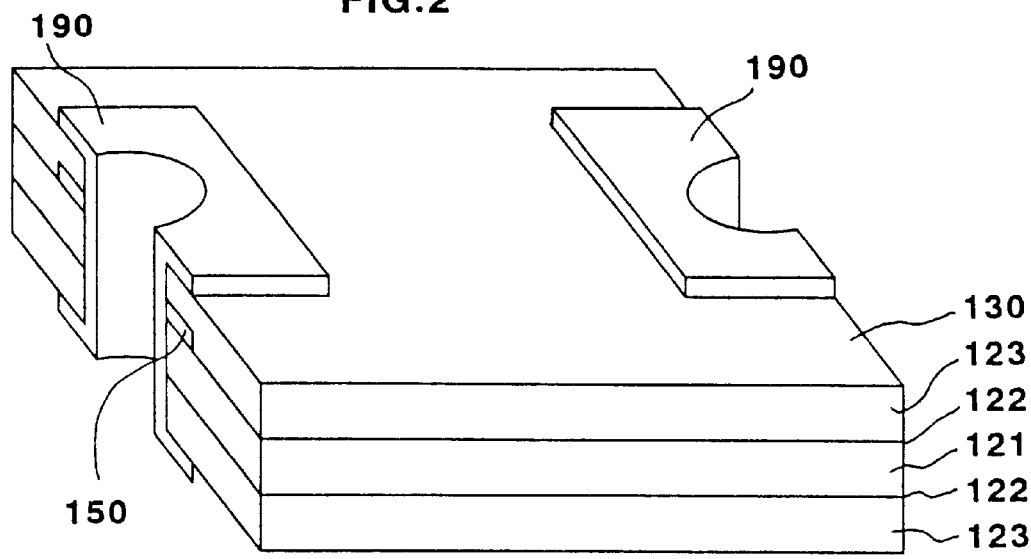
FIG. 2 is an external perspective view showing the first embodiment of the chip type electrostatic protective device according to the present invention.

Copper foil 130 was them laminated over the two sides of the base board as illustrated in FIG. 1(d), and the copper foil was patterned so as to define electrostatic protective device segments 150 by etching as illustrated in FIG. 1(e). The pattern for the electrostatic protective device segments 150 was defined such that a plurality of protective device circuit segments 150 each including a terminal segment 140 for interconnection were arranged along the longitudinal direction in an alternating fashion, and this longitudinal row was repeated in the lateral direction in a parallel arrangement. (FIG. 1(f) shows the front surface of the patterned base board, and FIG. 1(g) shows the reverse surface of the patterned base board.) FIG. 2 shows a completed electrostatic protective device according to the present invention.

Thereafter, an assembly of an outer insulating layer 123 and an outer metallic layer 130 consisting of copper foil coated with high polymer epoxy polymer MCF300E (tradename, Hitachi Kasei Kogyo KK) was placed on each side of the assembly formed with the protective device circuit segments 150 with the outer insulating layers 123 facing each other, and the entire assembly was thermally joined under the press condition of 170° C. of temperature, 90 minutes of press time, and 20 kg/cm² of press pressure, and the resulted assembly is illustrated in FIG. 1(h).

Figure 1K:
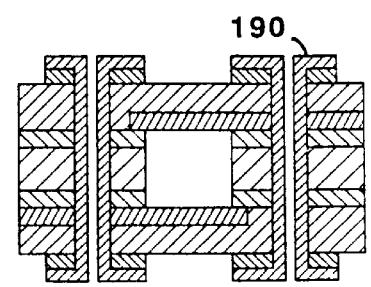
Figure 1L:
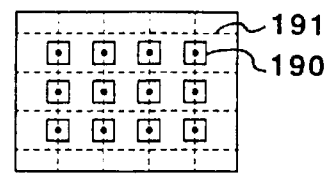

After holes 170 for interconnection were drilled in the assembly as illustrated in FIG. 1(i), a plating layer 180 was formed, for instance by electroless plating, to the thickness of 15 μm (FIG. 1(j)), and terminals for interconnection 190 were formed by removing unnecessary parts of the electroless plating layer 180 and the copper foil layer 130 by etching (FIGS. 1(k) and 1(l)).

Samples for comparison were prepared. The samples were identical to the first embodiment of the present invention in both the fabrication process and the materials except for that the holes for air gaps were not formed.

The base board for electrostatic protective devices prepared as samples for comparison and as the first embodiment of the present invention were cut into individual electrostatic devices, and subjected to various tests to determine their discharge voltage levels, and their effectiveness in protecting IC's.

TABLE 1

| gap size (μm) | discharge voltage levels | |
|---|---|---|
| | embodiments | samples for comparison |
| 20 | 200 to 350 | 4,000 or higher |
| 25 | 250 to 400 | 4,000 or higher |
| 37 | 400 to 500 | 4,000 or higher |
| 62 | 550 to 750 | 4,000 or higher |
| 87 | 650 to 900 | 4,000 or higher |
| 137 | 850 to 1,300 | 4,000 or higher |

Figure 4:
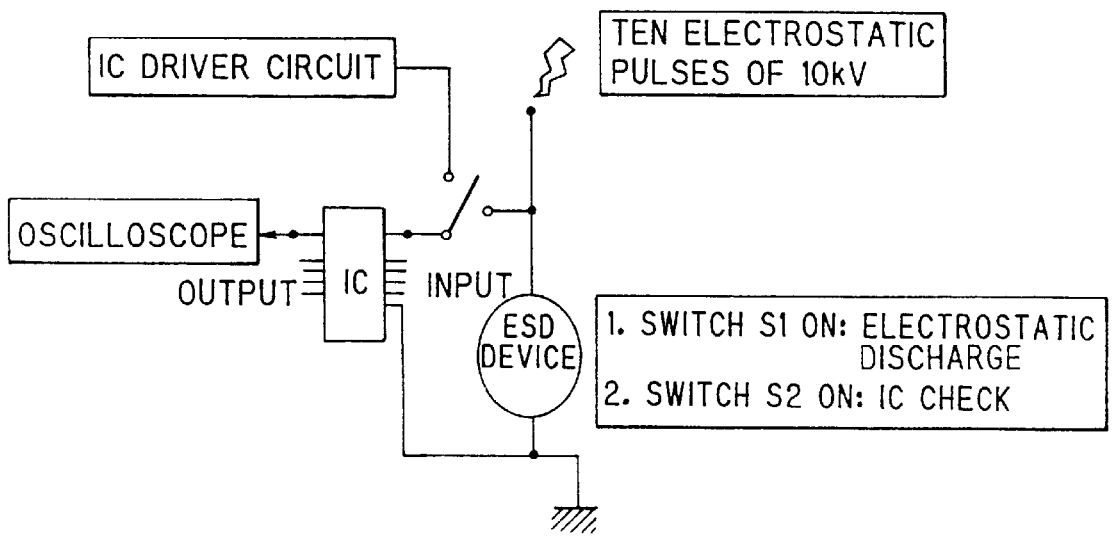
FIG. 4 is a block diagram showing the method of measuring the effectiveness of electrostatic protection device when electrostatic pulses are applied to an IC.

The discharge voltage levels were measured by applying a DC voltage. The effectiveness in protecting IC's was evaluated by using a circuit as illustrated in FIG. 4 and testing the operation of the IC (IC:SN75189AN made by Texas Instruments) after applying ten electrostatic pulses of 10 kV (pulse internal: one second) produced by ESD8012 made by Sanki Denshi Kogyo KK (waveform: IEC801-2 standard) to the circuit.

The measured values of the discharge voltage levels are summarized in Table 1. During the tests for the effectiveness in protecting IC's, the IC's operated normally in the instances of the embodiment of the present invention where the film thickness of Apical was 7.5, 12.5 and 25 μm, but the IC's failed in all of the instances of the samples for comparison including the instance where the film thickness of Apical was 7.5 μm.

Embodiment 2

Reference is made to FIGS. 5(a) to 5(i) illustrating different steps of fabricating a second embodiment of the present invention. The parts corresponding to those of the previous embodiments are denoted with like numerals. First of all, a pair of outer insulating layer assemblies were prepared. Each of the outer insulating layer assemblies consisted of an outer insulating layer 120 and a pair of outer metallic layers 130 consisting of copper foil. The outer insulating layer 120 may consist of high polymer epoxy polymer MCF300E (tradename, Hitachi Kasei Kogyo KK). One of the outer metallic layers 130 was patterned by etching so as to define a plurality of circuit segments 150 as illustrated in FIG. 5(a) in the same manner as the previous embodiment. An inner insulating layer assembly was prepared by laminating an inner insulating layer 121 consisting of polyimide film marketed under the tradename of Apical (Kanegahuchi Kagaku Kogyo KK), and a pair of surface layers each consisting of a tetrafluoroethylene/ethylene copolymer sheet marketed under the tradename of Aflex film (Asahi Glass KK) having the thickness of 6 μm and a lower softening point than the inner insulating layer 121, with the copper foil placed on each outer surface of the insulating base board as illustrated in FIG. 5(b). The Apical film (Kanegahuchi Kagaku Kogyo KK) was available in thicknesses of 7, 5, 12.5, 25, 38, 50, 75 and 125 μm, and the thickness of the copper foil was 18 μm. The laminating and bonding step was carried out under the press condition of 280° C. of temperature, 30 minutes of press time, and 20 kg/cm² of press pressure.

Holes 160 (1.2 mm in diameter) for defining air gaps were drilled in the assembly as illustrated in FIG. 5(c), and the copper foil was removed from the two sides of the base board by etching to form the perforated base board consisting of an inner insulating layer 121 and a pair of surface layers 122 as illustrated in FIG. 5(d).

Thereafter, the inner insulating layer assembly provided with holes 160 for defining air gaps was interposed between the two outer insulating layer assemblies with the circuit segments 150 facing each other as illustrated in FIG. 5(e). The lamination was carried out under the press condition of 170° C. of temperature, 90 minutes of press time, and 20 kg/cm² of press pressure, and the resulted assembly is illustrated FIG. 5(f).

After holes 170 for interconnection were drilled in the assembly as illustrated in FIG. 5(g) a plating layer 180 was formed, for instance by electroless plating, to the thickness of 15 μm (FIG. 5(h)), and terminals for interconnection 190 were formed by removing unnecessary parts of the electroless plating layer 180 and the copper foil layer 130 by etching (FIG. 5(i)).

This embodiment demonstrated substantially same properties as the first embodiment.

Embodiment 3

Reference is made to FIGS. 6(a) to 6(k) illustrating different steps of fabricating a third embodiment of the present invention. The parts corresponding to those of the previous embodiments are denoted with like numerals. First of all, copper foil 130 having the thickness of 18 μm was thermally laminated to the two sides of an inner insulating layer 121 consisting of Aflex film (tradename; Asahi Glass KK) having the thicknesses of 6 μm, 12 μm, 25 μm, 50 μm, 100 μm, 150 μm and 200 μm under the press condition of 280° C. of temperature, 30 minutes of press time, and 20 kg/cm² of press pressure. The contact surface of the copper foil facing the resin film was the glossier side. Holes 160 (1.2 μm in diameter) for defining air gaps were drilled in this assembly as illustrated in FIG. 6(a).

Electrostatic protective device circuit segments 150 were formed by depositing photoresist 132 to the shape of desired circuit segments on the copper foil, etching the copper foil, and removing the photoresist (as illustrated in FIGS. 6(b) to 6(d)). The pattern was arranged such that a plurality of electrostatic protective device circuit segments 150 each including a terminal segment 140 for interconnection were lined up in rows along the longitudinal, and this pattern repeats itself in the lateral direction as illustrated in FIGS. 6(e) and 6(f).

Thereafter, an assembly of an outer insulating layer 123 and an outer metallic layer 130 consisting of copper foil coated with high polymer epoxy polymer MCF300E (tradename, Hitachi Kasei Kogyo KK) was placed on each side of the assembly formed with the electrostatic protective device circuit segments 150 with the outer insulating layers 123 facing each other, and the entire assembly was thermally joined under the press condition of 170° C. of temperature, 90 minutes of press time, and 20 kg/cm² of press pressure, and the resulted assembly is illustrated in FIG. 6(g).

After holes 170 for interconnection were drilled in the assembly as illustrated in FIG. 6(h), a plating layer 180 was formed, for instance by electroless plating, to the thickness of 15 μm (FIG. 6(i)), and terminals for interconnection 190 were formed by removing unnecessary parts of the electroless plating layer 180 and the copper foil layer 130 by etching (FIGS. 6(j) and 6(k)).

The order of the drilling step of FIG. 6(a) and the circuit forming step of FIGS. 6(b) to 6(d) can be interchanged. FIG. 6 illustrates the case in which dry film was used for etching, but the present invention is by no means limited to this etching process.

Embodiment 4

Figure 7A:
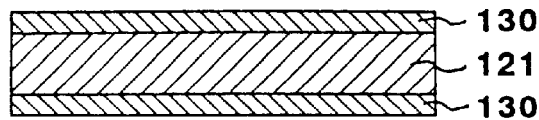
FIGS. 7(a) to 7(j) are sectional views showing different fabrication steps to illustrate the fourth embodiment of the present invention.

Reference is made to FIGS. 7(a) to 7(k) illustrating different steps of fabricating a fourth embodiment of the present invention. The parts corresponding to those of the previous embodiments were denoted with like numerals. First of all, copper foil 130 having the thickness of 18 μm was thermally laminated to the two sides of an inner insulating layer 121 consisting of Aflex film (tradename; Asahi Glass KK) having the thicknesses of 6 μm, 12 μm, 25 μm, 50 μm, 100 μm, 150 μm and 200 μm under the press condition of 280 ° C. of temperature, 30 minutes of press time, and 20 kg/cm² of press pressure. The contact surface of the copper foil facing the resin film was the glossier side (as illustrated in FIG. 7(a)).

Figure 7B:
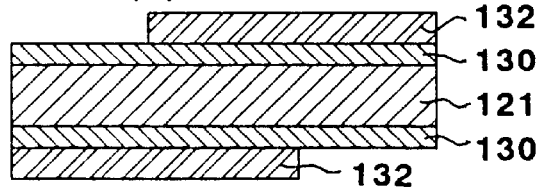
Figure 7C:
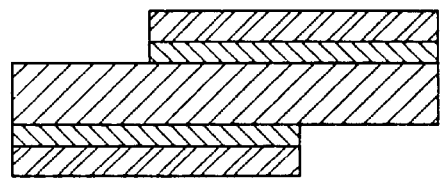
Figure 7D:
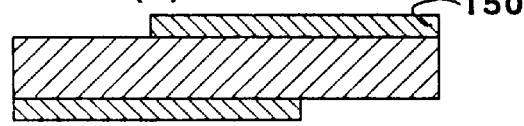

Electrostatic protective device circuit segments 150 were formed by depositing photoresist 132 to the shape of desired circuit segments on the copper foil, etching the copper foil, and removing the photoresist (as illustrated in FIGS. 7(b) to 7(d)). The pattern was arranged such that a plurality of electrostatic protective device circuit segments 150 each including a terminal segment 140 for interconnection were lined up in rows along the longitudinal direction, and this pattern repeats itself in the lateral.

Figure 7E:
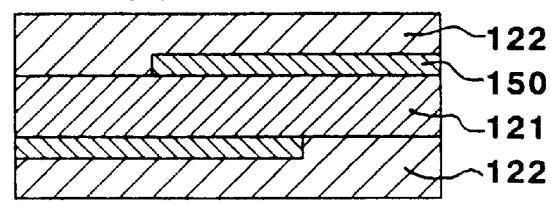

A surface layer assembly consisting of copper foil coated with a surface layer 122 consisting of high polymer epoxy polymer MCF3000E (tradename, Hitachi Kasei Kogyo KK) was laminated on each side of the inner insulating layer assembly under the thermal press condition of 170° C. of temperature, 90 minutes of press time, and 20 kg/cm² of press pressure, and the copper foil was then entirely removed (as illustrated in FIG. 7(e)).

Copper foil coated with high polymer epoxy polymer MCF3000E (tradename, Hitachi Kasei Kogyo KK) was used in this embodiment, but it is not mandatory to use an insulating material laminated with copper foil. Also, even when material laminated with copper foil is used, it is possible to interchange the orders of drilling the holes, and removing the copper foil.

Figure 7F:
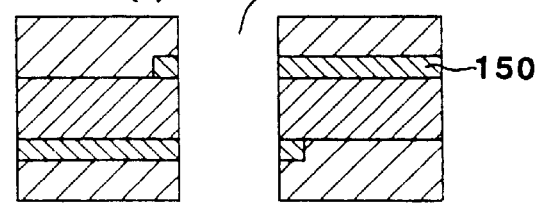
Figure 7G:
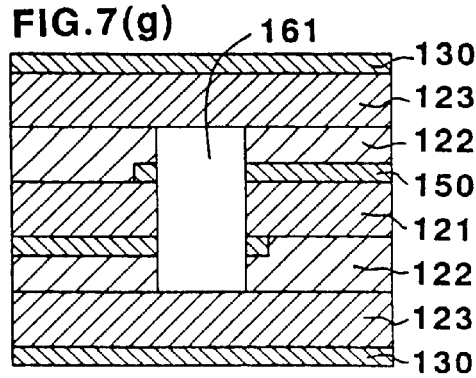

Thereafter, holes 170 (1.2 mm in diameter) for defining air gaps were drilled (as illustrated in FIG. 7(f)), and copper foil coated with polymer epoxy polymer MCF3000E (tradename, Hitachi Kasei Kogyo KK) having a low tendency to flow during the process of heating for bonding purpose was placed over the assembly. The assembly was again subjected to a pressing process under the same condition (as illustrated in FIG. 7(g)).

Figure 7H:
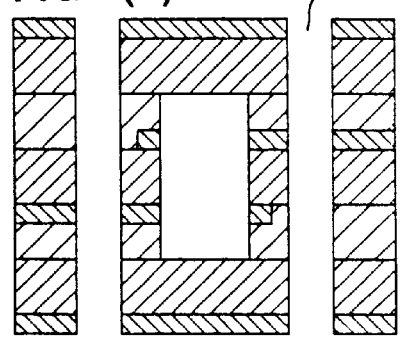
Figure 7I:
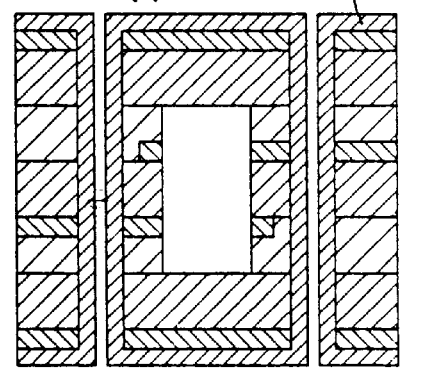
Figure 7J:
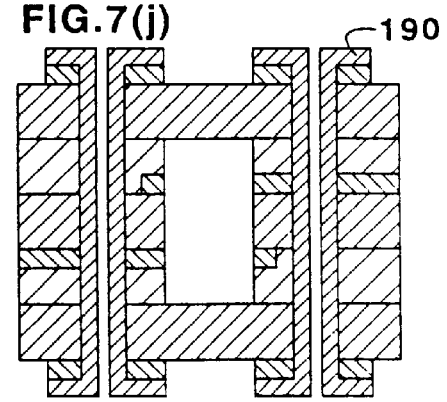

Holes 170 for interconnection were drilled as illustrated in FIG. 7(h), and an electroless plating layer 180 was formed to the thickness of 15 μm. Then, terminals 190 for interconnection were formed by etching (as illustrated in FIG. 7(j)).

Embodiment 5

Reference is made to FIGS. 8(a) to 8(g) illustrating different steps of fabricating a fifth embodiment of the present invention. The parts corresponding to those of the previous embodiments were denoted with like numerals. First of all, a pair of surface layer assemblies were prepared. Each of the surface layer assemblies consisted of a surface layer 122, and copper foil covering one side of the surface layer 122. The surface layer 122 may consist of tetrafluoroethylene/ethylene copolymer sheet marketed under the tradename of Aflex film (Asahi Glass KK) having the thickness of 6 μm. The copper foil 130 was then patterned so as to defined a plurality of circuit segments 150 in the same manner as in the previous embodiments.

An inner insulating layer consisting of polyimide film marketed under the tradename of Apical (Kanegahuchi Kagaku Kogyo KK) was prepared. The inner insulating layer 121 was laminated between the two surface layer assemblies with the circuit segments 150 facing the inner insulating layer 121, as illustrated in FIG. 8(b), under the press condition of 280° C. of temperature, 30 minutes of press time, and 20 kg/cm² of press pressure. The Apical film (Kanegahuchi Kagaku Kogyo KK) was available in thicknesses of 7, 5, 12.5, 25, 38, 50, 75 and 125 μm, and the thickness of the copper foil was 18 μm. The Aflex film has a softening point than the Apical film.

Figure 8A:
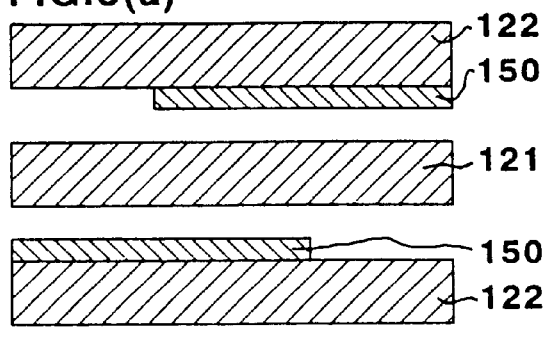
FIGS. 8(a) to 8(g) are sectional views showing different fabrication steps to illustrate the fifth embodiment of the present invention.
Figure 8E:
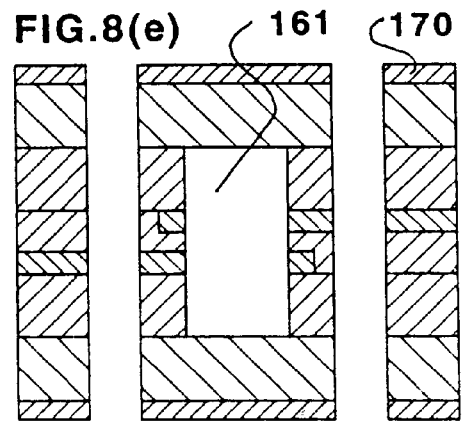
Figure 8B:
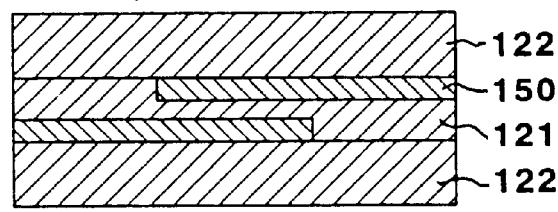
Figure 8F:
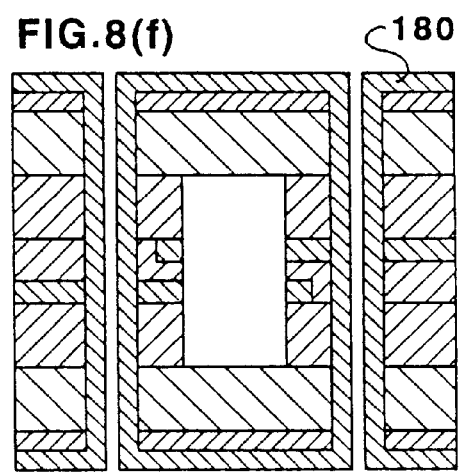
Figure 8C:
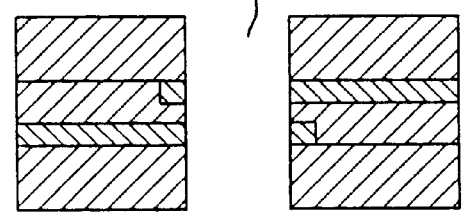
Figure 8D:
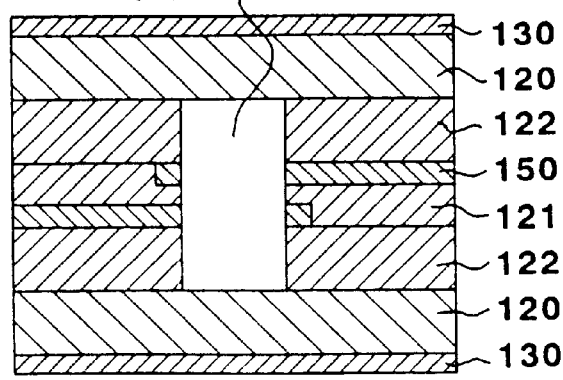

Holes 160 (1.2 mm in diameter) for defining air gaps were drilled in the assembly as illustrated in FIG. 8(c), and a pair of outer insulating layer assemblies were placed over the assembly as illustrated in FIG. 8(d). Each of the outer insulating layer assemblies comprises copper foil 130 coated with an outer insulating layer 120 consisting of high polymer epoxy polymer MCF3000E (tradename, Hitachi Kasei Kogyo KK) having a low tendency to flow during the process of heating for bonding purpose. The assembly was again subjected to a pressing process under the same condition.

Figure 8G:
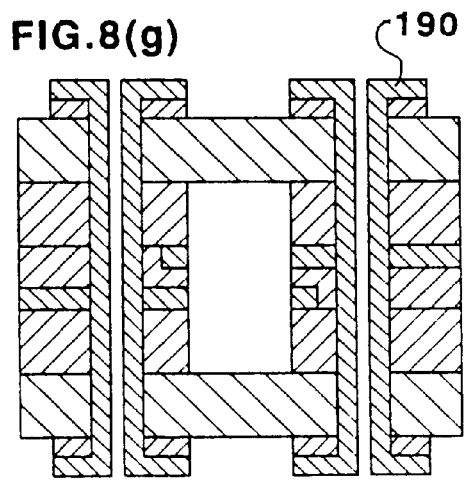

After holes 170 for interconnection were drilled in the assembly as illustrated in FIG. 8(e), a plating layer 180 was formed, for instance by electroless plating, to the thickness of 15 µm (FIG. 8(f)), and terminals for interconnection 190 were formed by removing unnecessary parts of the electroless plating layer 180 and the copper foil layer 130 by etching (FIG. 8(g) ).

This embodiment demonstrated substantially same properties as the first embodiment.

Samples for comparison were prepared. The samples were identical to the third through fifth embodiments of the present invention in both the fabrication process and the materials except for that the holes for air gaps were not formed. The base board for electrostatic protective devices prepared as samples for comparison and as embodiments of the present invention were cut into individual electrostatic devices, and subjected to various tests to determine their discharge voltage levels, and their effectiveness in protecting IC's. The discharge voltage levels were measured by applying a DC voltage.

TABLE 2

| | discharge voltage levels | |
| --- | --- | --- |
| gap size (µm) | embodiments | samples for comparison |
| 6 | 150 to 250 | 1,500 to 1,800 |
| 12 | 250 to 350 | 2,900 to 3,300 |
| 25 | 400 to 500 | 4,000 or higher |
| 50 | 500 to 700 | 4,000 or higher |
| 100 | 900 to 1,100 | 4,000 or higher |
| 150 | 1,200 to 1,300 | 4,000 or higher |

The effectiveness in protecting IC's was evaluated by using a circuit as illustrated in FIG. 4 and testing the operation of the IC (IC:SN75189AN made by Texas Instruments) after applying ten electrostatic pulses of 10 kV (pulse internal: one second) produced by ESD8012 made by Sanki Denshi Kogyo KK (waveform: IEC801-2 standard) to the circuit.

The measured values of the discharge voltage levels were summarized in Table 2. During the tests for the effectiveness in protecting IC's, the IC's operated normally in the instances of the embodiments of the present invention where the film thickness was 6, 12, 25 and 50 µm, but the IC's failed in all of the instances of the samples for comparison including the instance where the film thickness was 6 µm.

Figure 9A:
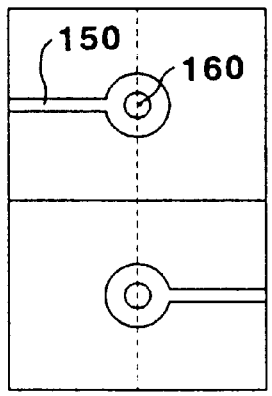
FIGS. 9(a) to 9(c) are plan views showing possible positional relationships between holes for defining air gaps and circuit segments.
Figure 9B:
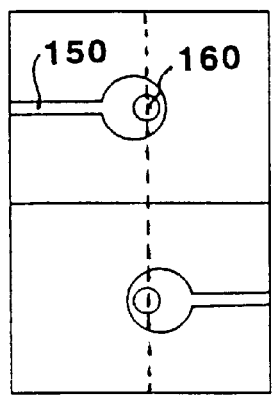
Figure 9C:
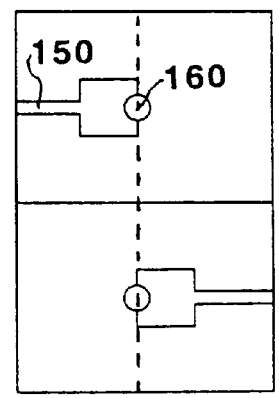

FIGS. 9(a) to 9(c) illustrate various relationship between the position of each hole 160 for defining an air gap with the associated circuit segment 150. As can be appreciated, the hole 160 may either entirely surrounded by the circuit segment 150 (FIGS. 9(a) and 9(b)) or only partly surrounded by the circuit segment 150 (FIG. 9(c)). It suffices if the hole 160 passes through at least part of the associated circuit segment 150.

Embodiment 6

Figure 10A:
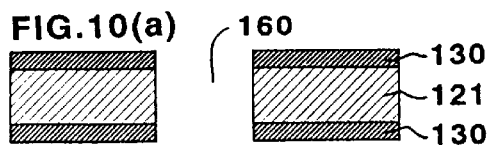
FIGS. 10(a) to 10(l) show different fabrication steps to illustrate the sixth embodiment of the present invention, (a) to (d) and (g) to (k) being sectional views, (e) and (f) being plan views showing the circuit patterns on the front and reverse surface of the base board at step (d), (l) being a plan view showing how the base board is cut apart into individual devices.

Reference is made to FIGS. 10(a) to 10(l) illustrating different steps of fabricating a sixth embodiment of the present invention. The parts corresponding to those of the previous embodiments were denoted with like numerals. First of all, copper foil 130 having the thickness of 18 µm was thermally laminated to the two sides of an inner insulating layer 121 consisting of Aflex film (tradename; Asahi Glass KK) base boards having the thickness of 100 µm under the press condition of 280° C. of temperature, 30 minutes of press time, and 20 kg/cm² of press pressure. The contact surface of the copper foil facing the resin film was the glossier side. Holes 160 (1.2 mm in diameter) for defining air gaps were drilled in the assembly as illustrated in FIG. 10(a).

Figure 10B:
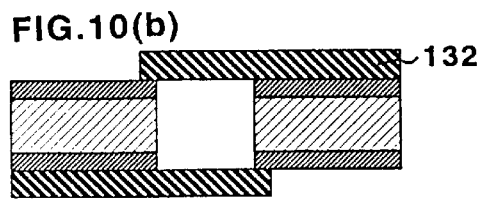
Figure 10C:
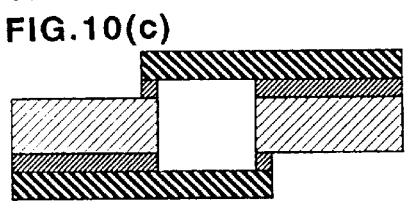
Figure 10D:
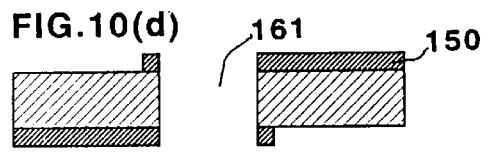
Figure 10E:
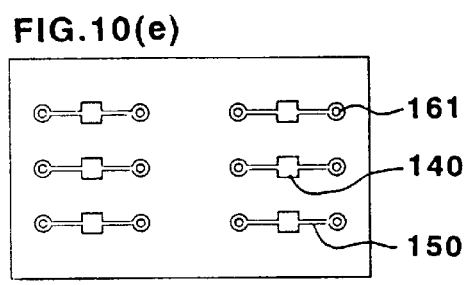
Figure 10F:
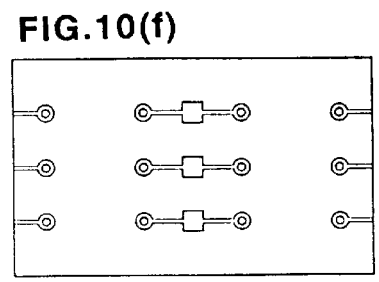

Etching resist 132 was applied to the surface of each layer of copper foil 130, and unnecessary part of the copper foil was selectively removed by spraying chemical etching liquid primarily consisting of ferric chloride solution to form a plurality of electrostatic protective device circuit segments 150 and terminals for interconnection 140 which were connected to associated circuit segments (as illustrated in FIGS. 10(b) to 10(d)). The pattern was arranged such that a plurality of electrostatic protective device circuit segments 150 were lined up in rows along the longitudinal direction with each segment including terminal segment 140 for interconnection, and this pattern repeats itself in the lateral direction as illustrated in FIGS. 10(e) to 10(f).

Figure 10G:
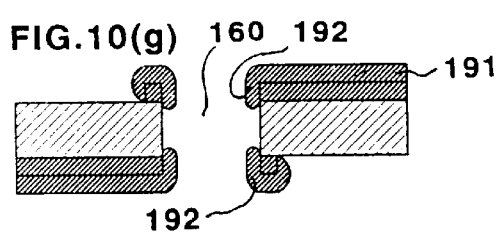

A copper plating layer 191 was deposited on the exposed surface of the copper layer 130 by an electroless plating process, and, in particular, end surfaces of the copper foil layer 130 exposed from the wall of the holes 160 for defining air gaps were plated with a copper layer, defining projections 192 (as illustrated in FIG. 10(g)). The thickness of the copper plating layer 191 and the minimum distances between the projections 192 were measured, and assemblies were prepared so that the minimum distances between the projections were 30 µm and 50 µm.

Figure 10H:
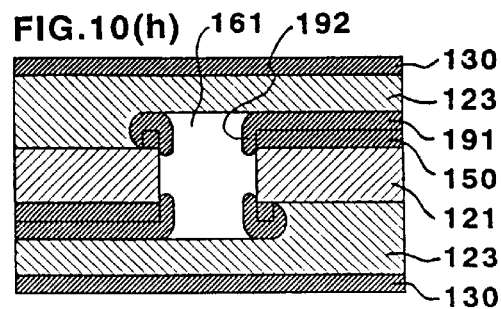
Figure 10I:
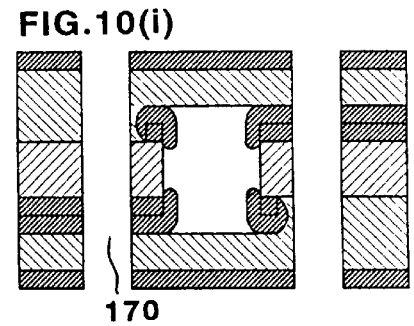
Figure 10J:
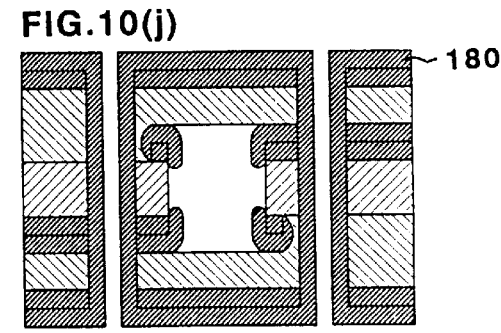
Figure 10K:
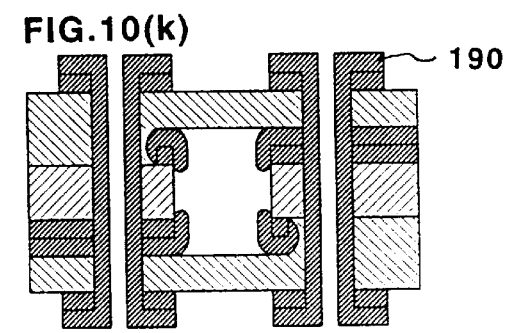
Figure 10L:
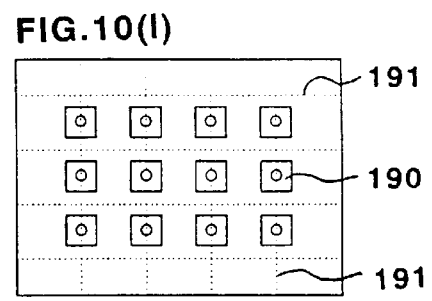

Copper foil coated with polymer epoxy polymer MCF3000E (tradename, Hitachi Kasei Kogyo KK) was laminated on the two sides of this assembly under the thermal press condition of 170° C. of temperature, 90 minutes of press time, and 20 kg/cm² of press pressure (as illustrated in FIG. 10(h)). Through holes 170 were then drilled through the assembly as illustrated in FIG. 10(i), and electroless plating (as indicated by numeral 180) was carried out to the thickness of 15 µm to the inner wall of the through holes and the entire surface of the copper foil (as illustrated in FIG. 10(j)). Then, terminal segments 190 for interconnection were formed by etching (as illustrated in FIG. 10(k)).

Embodiment 7

Reference is made to FIGS. 11(a) to 11(l) illustrating different steps of fabricating a seventh embodiment of the present invention. The parts corresponding to those of the previous embodiments are denoted with like numerals. First of all, copper foil 130 having the thickness of 18 µm was thermally laminated to the two sides of an inner insulating layer 121 consisting of Aflex film (tradename; Asahi Glass KK) base boards having the thickness of 100 µm under the press condition of 280° C. of temperature, 30 minutes of press time, and 20 kg/cm² of press pressure. The contact surface of the copper foil facing the resin film was the glossier side (as illustrated in FIG. 11(a)).

Etching resist 132 was applied to the surface of each layer of copper foil 130, and unnecessary part of the copper foil was selectively removed by spraying chemical etching liquid primarily consisting of ferric chloride solution to form a plurality of electrostatic protective device circuit segments 150 and terminals for interconnection 140 which were connected to associated circuit segments (as illustrated in FIGS. 11(b) to 11(d)). The pattern was arranged such that a plurality of electrostatic protective device circuit segments 150 were lined up in rows along the longitudinal direction with each segment including terminal segment 140 for interconnection, and this pattern repeats itself in the lateral direction.

Copper foil coated with polymer epoxy polymer MCF3000E (tradename, Hitachi Kasei Kogyo KK) was laminated on the two sides of this assembly under the thermal press condition of 170° C. of temperature, 90 minutes of press time, and 20 kg/cm² of press pressure, and the copper foil was then entirely etched away by spraying chemical etching liquid (as illustrated in FIG. 11(e)).

Copper foil coated with polymer epoxy polymer MCF3000E (tradename, Hitachi Kasei Kogyo KK) was used in this embodiment, but it was not mandatory to use an insulating material laminated with copper foil.

Thereafter, holes 160, measuring 1.2 mm in diameter, were drilled (as illustrated in FIG. 10(f)), and the end surfaces exposed from the wall of the holes were thickly plated with copper by a electroless plating process so as to define projections 192 (as illustrated in FIG. 11(g)). The thickness of the copper plating and the minimum distances between the projections 192 were measured, and base board were prepared so that the minimum distances between the projections were 30 μm and 50 μm.

Then, copper foil coated with polymer epoxy polymer MCF3000E (tradename, Hitachi Kasei Kogyo KK) having a low tendency to flow during the process of heating for bonding purpose was placed over the assembly. The assembly was again subjected to a pressing process under the same condition (as illustrated in FIG. 11(h)).

Through holes were drilled as illustrated in FIG. 10(i), and electroless plating was carried out to the thickness of 15 μm to the inner wall of the through holes 170 and the entire surface of the copper foil (as indicated by numeral 180 in FIG. 11(j)). Then, terminal segments 190 for interconnection were formed by etching (as illustrated in FIG. 11(k)).

The discharge voltage was measured and the effectiveness in protecting IC's was evaluated by using chip type electrostatic protective devices which were prepared from the base board incorporating a number of chip type electrostatic protective devices and prepared according to the sixth and seventh embodiments of the present invention, and cutting it into individual electrostatic devices.

The discharge voltage was measured by applying DC voltage. The effectiveness in protecting IC's was evaluated by using a circuit as illustrated in FIG. 5 and testing the operation of the TTL IC (IC:SN75189AN made by Texas Instruments) after applying ten electrostatic pulses of 10 kV (pulse internal: one second) produced by ESD8012 made by Sanki Denshi Kogyo KK (waveform: IEC801-2 standard) to the circuit.

According to the test thus conducted, the discharge voltage was in the range of 480 to 520 volts (n=5) for those involving the distance of 30 μm between the projections, and in the range of 670 to 750 volts (n=5) for those involving the distance of 50 μm between the projections. The IC's operated normally after the test for the effectiveness in protecting IC's for both those involving the distance of 30 μm between the projections and those involving the distance of 50 μm between the projections.

Embodiment 8

Reference is made to FIGS. 12(a) to 12(j) illustrating different steps of fabricating a eighth embodiment of the present invention. The parts corresponding to those of the previous embodiments are denoted with like numerals. First of all, extremely thin copper foil having the thickness of 5 μm was attached to one side of an outer insulating layer 120, and copper foil 130 having the thickness of 18 μm was attached to the other side of the insulating base board. The base material for this outer insulating layer 120 consisted of polytetrafluoroethylene resin prepreg reinforced by home-made glass cloth, and was laminated and pressed in combination with the extremely thin copper foil and the normal copper foil under the press condition of 380° C. of temperature, 90 minutes of press time, and 20 kg/cm² of press pressure.

Sonne EDUV (tradename, Kansai Paint KK) consisting of resist for electro-deposition was deposited on the base board, and after a series of work including photographic exposure and development, a desired resist pattern was formed.

Figure 12A:
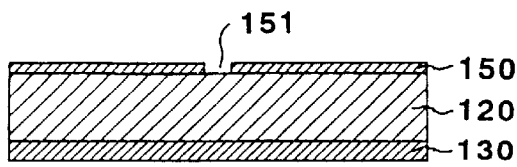
FIGS. 12(a) to 12(j) show different fabrication steps to illustrate the eighth embodiment of the present invention, (a) and (c) to (i) being sectional views, (b) being a plan view showing the circuit patterns on the front surface of the base board at step (a), (j) being a plan view showing how the base board is cut apart into individual devices.
Figure 12B:
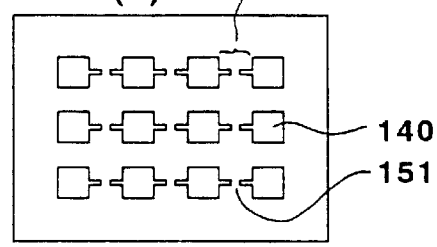

The extremely thin copper foil was patterned so as to define electrostatic protective device circuit segments 150 including terminal segments 140 by etching as illustrated in FIG. 12(a). The pattern was defined such that a plurality of electrostatic protective device circuit segments 150 and terminal segments 140 for interconnection were arranged along the lateral direction in an alternating fashion, and this lateral row was repeated in the longitudinal direction in a parallel arrangement. FIG. 12(b) shows a plan view of the patterned base board. The sizes of the discharge gap 151 were 20, 50, 100, 150 and 200 μm.

Figure 12C:
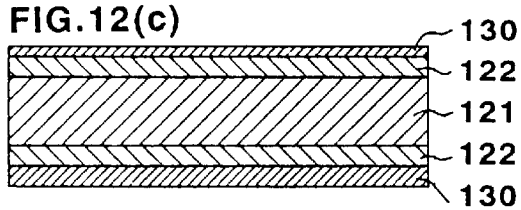

An inner insulating layer 121 consisting of polyimide film marketed under the tradename of Apical (Kanegahuchi Kagaku Kogyo KK) having the thickness of 125 μm was laminated with a pair of surface layers 122 each consisting of a tetrafluoroethylene/ethylene copolymer sheet marketed under the tradename of Aflex film (Asahi Glass KK) having the thickness of 6 μm, and with a pair of copper foil layers 130 covering the outer surfaces of the corresponding surface layers 122 under the press condition of 280° C. of temperature, 30 minutes of press time, and 20 kg/cm² of press pressure (as illustrated in FIG. 12(c)).

Figure 12D:
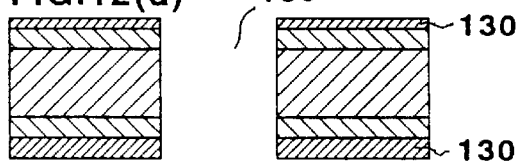
Figure 12E:
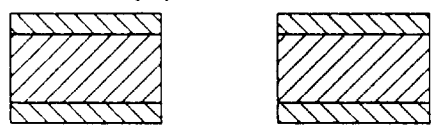

Holes 160 (1.2 mm in diameter) for defining air gaps were drilled in the laminated assembly as illustrated in FIG. 12(d), and the copper foil 130 was entirely removed from both sides of the laminated assembly by etching to form a perforated inner insulating layer assembly as illustrated in FIG. 12(e).

Figure 12F:
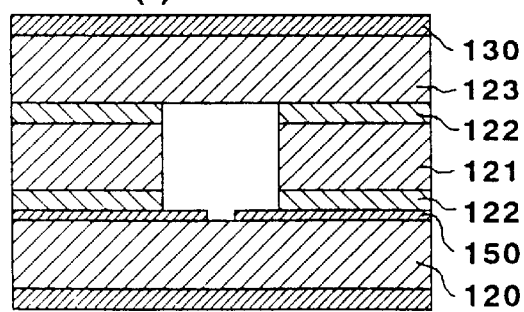
Figure 12G:
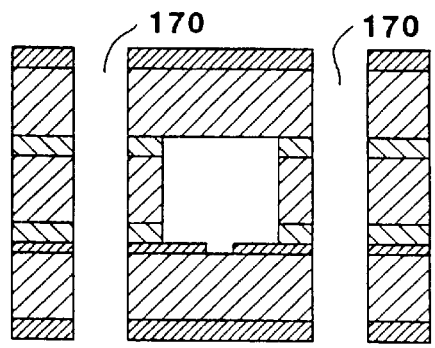
Figure 12H:
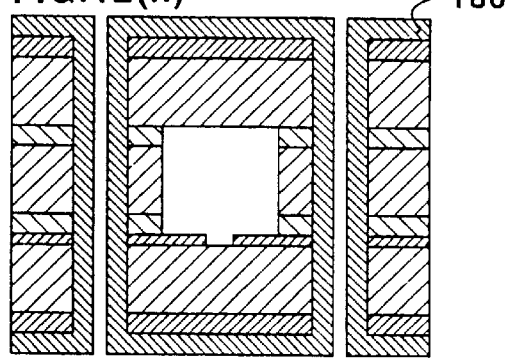
Figure 12I:
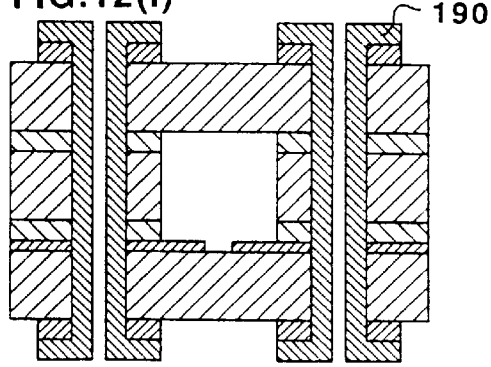
Figure 12J:
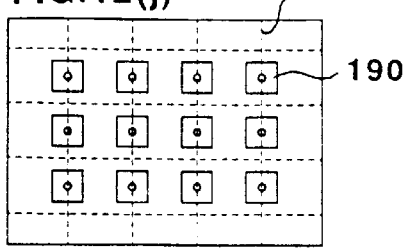

The outer insulating layer assembly formed with electrostatic protective device circuit segments 150, the inner insulating layer assembly provided with holes 160 for defining air gaps, and another outer insulating layer assembly consisting of polytetrafluoroethylene resin film having one side thereof covered by copper foil were laminated and bonded together under heated and pressurized condition (as illustrated in FIG. 12(f)). Holes 170 for interconnection were formed (as illustrated in FIG. 12(g)), plating was performed to the thickness of 15 μm (as indicated by numeral 180 in FIG. 12(h)), and terminals 190 for interconnection were formed by etching (as illustrated in FIGS. 12(i) and 12(j)).

Embodiment 9

Reference is made to FIGS. 13(a) to 13(g) illustrating different steps of fabricating a ninth embodiment of the present invention. The parts corresponding to those of the previous embodiments are denoted with like numerals. First of all, one side of an outer insulating layer assembly consisting of the same material as the previous embodiment was patterned so as to define electrostatic protective device circuit segments 150 and terminal segments 140 by using the same process steps as the previous embodiment (as illustrated in the sectional view of FIG. 13(a), and the plan view of FIG. 13(b)).

An inner insulating layer 121 consisting of polyimide film marketed under the tradename of Apical (Kanegahuchi Kagaku Kogyo KK) having the thickness of 125 μm was prepared, and holes 160 (1.4 mm in diameter) for defining air gaps were drilled in the inner insulating layer 121 (as illustrated in FIG. 13(c)).

Another outer insulating layer assembly was prepared. The second outer insulating layer assembly comprises an outer insulating layer 123 consisting of polytetrafluoroethylene resin film, and copper foil 130 covering one side of this outer insulating layer 123. The first outer insulating layer assembly formed with electrostatic protective device circuit segments 150, the inner insulating layer assembly provided with holes 160 for defining air gaps, and the second outer insulating layer assembly were laminated and bonded under the press condition of 280° C. of temperature, 30 minutes of press time, and 20 kg/cm² of press pressure (as illustrated in FIG. 13(d)). A surface layer 122 consisting of a tetrafluoroethylene/ethylene copolymer sheet marketed under the tradename of Aflex film (Asahi Glass KK) and having the thickness of 6 μm was interposed in the interface between each adjacent pair of the assemblies.

Holes 170 for interconnection were formed (as illustrated in FIG. 13(e)), plating was performed to the thickness of 15 μm (as indicated by numeral 180 in FIG. 13(f)), and terminals 190 for interconnection were formed by etching (as illustrated in FIG. 13(g)).

Embodiment 10

Reference is made to FIGS. 14(a) to 14(g) illustrating different steps of fabricating a tenth embodiment of the present invention. The parts corresponding to those of the previous embodiments are denoted with like numerals. First of all, metallic foil 210 consisting of a first copper layer 211 having the thickness of 15 μm, a second copper layer 213 having the thickness of 5 μm, and a nickel-phosphorus alloy layer 212 having the thickness of 0.2 μm interposed between the two copper layers was prepared as illustrated in FIG. 14(a).

This metallic foil 210 was attached to one side of an outer insulating layer 123 with the second copper layer 213 facing the outer insulating layer 123, and copper foil 130 having the thickness of 18 μm was attached to the other side of the outer insulating layer 123 as illustrated in FIG. 14(b).

The first copper layer 211 of the three layers of the metallic foil 210 covering the outer insulating layer assembly was removed by etching except for the part intended to define terminals 190 for interconnection (as illustrated in FIG. 14(c)), and the interposed layer 212 was then removed so as to expose the second copper layer 213. Unnecessary part of the second copper layer 213 was removed by etching so as to define a plurality of electrostatic protective device circuit segments 150 and the associated terminal segments 140 (which are shown in the sectional view of FIG. 14(d), and the plan view of FIG. 14(e)).

An inner insulating layer 121 consisting of polyimide film marketed under the tradename of Apical (Kanegahuchi Kagaku Kogyo KK) having the thickness of 125 μm was prepared, and holes 160 (1.4 mm in diameter) for defining air gaps were drilled in the inner insulating layer 121 (as illustrated in FIG. 14(f)).

Another outer insulating layer assembly was prepared. The second outer insulating layer assembly comprises an outer insulating layer 123 consisting of polytetrafluoroethylene resin film, and copper foil 130 covering one side of this outer insulating layer 123. The first outer insulating layer assembly formed with electrostatic protective device circuit segments 150, the inner insulating layer assembly provided with holes 160 for defining air gaps, and the second outer insulating layer assembly were laminated and bonded under the press condition of 280° C. of temperature, 30 minutes of press time, and 20 kg/cm² of press pressure (as illustrated in FIG. 14(g)). A surface layer 122 consisting of a tetrafluoroethylene/ethylene copolymer sheet marketed under the tradename of Aflex film (Asahi Glass KK) and having the thickness of 6 μm was interposed in the interface between each adjacent pair of the assemblies.

Holes 170 for interconnection were formed (as illustrated in FIG. 14(h)), plating was performed to the thickness of 15 μm (as indicated by numeral 180 in FIG. 14(i)), and terminals 190 for interconnection were formed by etching (as illustrated in FIG. 14(j)).

Figure 3:
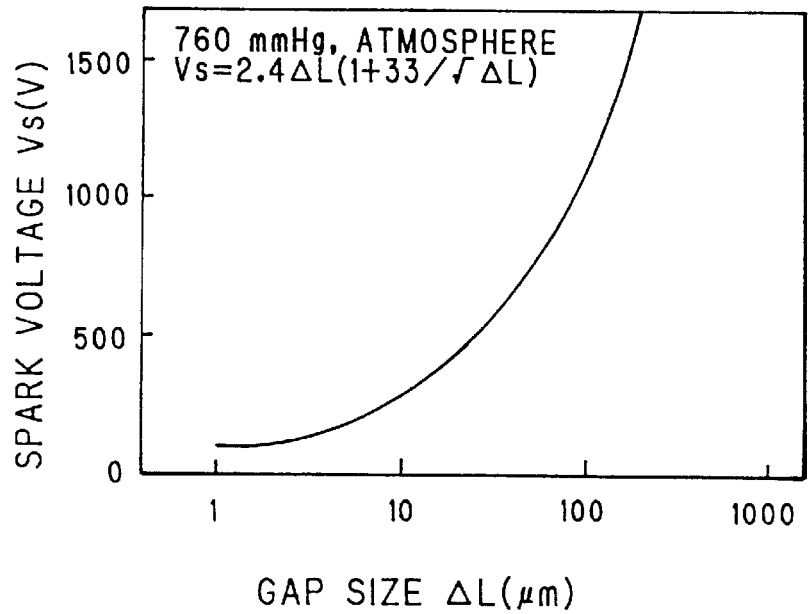
FIG. 3 is a diagram showing the relationship between the gap size between a pair of parallel electrodes and the spark voltage.

Thus, the device was similarly prepared as the previous embodiment except for that the thickness of the copper foil corresponding to the parts defining the terminal 190 for interconnection was increased (as illustrated in FIG. 3(j)).

Samples for comparison were prepared. The samples were identical to the eighth to tenth embodiments of the present invention in both the fabrication process and the materials except for that the holes for air gaps were not formed.

The base board for chip type electrostatic protective devices prepared as samples for comparison and as embodiments of the present invention were cut into individual electrostatic devices, and subjected to various tests to determine their discharge voltage levels, and their effectiveness in protecting IC's.

TABLE 3

| gap size (μm) | discharge voltage levels (V) | | | |
|---|---|---|---|---|
| | embodiment #8 | embodiment #9 | embodiment #10 | samples for comparison |
| 20 | 300 to 400 | 300 to 450 | 350 to 450 | 4,000 or higher |
| 50 | 600 to 800 | 650 to 900 | 650 to 900 | 4,000 or higher |
| 100 | 850 to 1,150 | 900 to 1,200 | 950 to 1,100 | 4,000 or higher |
| 150 | 1,200 to 1,400 | 1,300 to 1,600 | 1,250 to 1,500 | 4,000 or higher |

The discharge voltage levels were measured by applying a DC voltage. The effectiveness in protecting IC's was evaluated by using a circuit as illustrated in FIG. 4 and testing the operation of the IC (IC:SN75189AN made by Texas Instruments) after applying ten electrostatic pulses of 10 kV (pulse internal: one second) produced by ESD8012 made by Sanki Denshi Kogyo KK (waveform: IEC801-2 standard) to the circuit.

According to the conducted test, the ICTs continued to operate satisfactorily after the test for all of the embodiments #8 to #10 and for the discharge gaps of 20 μm and 50 μm, but the IC's did not operate normally after the test for the samples even when the discharge gap was 20 μm.

Figure 15A:
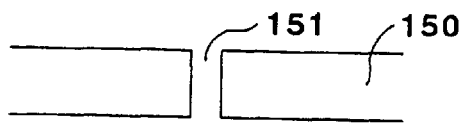
FIGS. 15(a) to 15(g) are plan views showing possible variations of the discharge gaps.
Figure 15B:
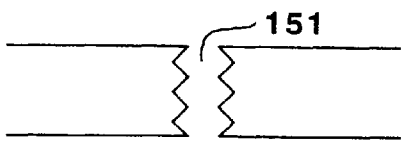
Figure 15C:
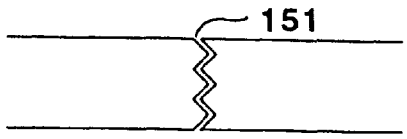
Figure 15D:
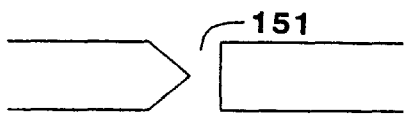
Figure 15E:
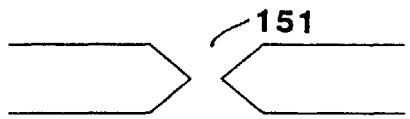
Figure 15F:
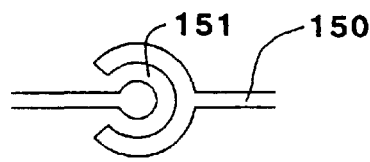
Figure 15G:
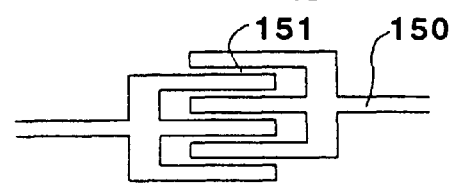

FIGS. 15(a) to (g) show various possible forms of air gaps 151 although they are not intended to be exclusive. FIG. 15(a) shows a parallel air gaps. FIGS. 15(b) and (c) each show a pair of jagged edges opposing each other. The projections and recesses of the opposing edges oppose each other in the case of the embodiment of FIG. 15(b), but the projections of one of the edges opposes the recesses of the opposing edge, and vice versa, in the case of the embodiment of FIG. 15(c). In the embodiment of FIG. 15(d), one of the opposing edges was straight while the other opposing edge was provided with a projection having a triangular shape. In the embodiment of FIG. 15(e), both of the opposing edges are provided with a projection having a triangular shape. In the embodiment of FIG. 15(f), one of the opposing edges was defined by a head at an end of a strip while the other opposing edge was defined by a C shaped section surrounding the head portion. In the embodiment of FIG. 15(f), both of the opposing edges are defined by fork shaped ends which are interdigitated with each other.

Embodiment 11

Reference is made to FIGS. 16(a) to 16(g) illustrating different steps of fabricating an eleventh embodiment of the present invention. The parts corresponding to those of the previous embodiments are denoted with like numerals. First of all, extremely thin copper foil having the thickness of 5

μm was attached to one side of an outer insulating layer 123, and copper foil 130 having the thickness of 18 μm was attached to the other side of the insulating base board. The base material for this outer insulating layer 123 consisted of polytetrafluoroethylene resin prepreg reinforced by homemade glass cloth, and was laminated and pressed in combination with the extremely thin copper foil and the normal copper under the press condition of 380° C. of temperature, 90 minutes of press time, and 20 kg/cm² of press pressure.

Sonne EDUV (tradename, Kansai Paint KK) consisting of resist for electro-deposition was deposited on this outer insulating layer assembly, and after a series of work including photographic exposure and development, a desired resist pattern was formed. The copper foil was then patterned so as to define electrostatic protective device circuit segments 150 by etching away the exposed part of the copper foil by spraying chemical etching liquid primarily consisting of ferric chloride solution as illustrated in FIG. 16(a). The pattern was defined such that a plurality of electrostatic protective device circuit segments 150 each including a terminal segments 140 for interconnection were arranged along the lateral direction in an alternating fashion, and this lateral row was repeated in the longitudinal direction in a parallel arrangement (as illustrated in FIG. 16(b)).

For the purpose of test, the etching condition (the composition, temperature and spraying pressure of the etching liquid, and the etching time) was controlled so that the discharge gaps be 100 μm, and electroless plating was performed on the discharge gaps and the circuit segments so as to obtain an outer insulator layer assembly having the discharge gaps of 30 μm and that having the discharge gaps of 50 μm. For the actual commercial production process, the etching condition was first roughly selected and, after the typical size of the gaps was measured, the time period for etching was determined according to the difference between the desired gap size and the actually measured gap size so that the precision of the gap size may be controlled by varying the plating time within a range that can be easily controlled (as illustrated in FIG. 16(c)).

An inner insulating layer 121 consisting of polyimide film marketed under the tradename of Apical (Kanegahuchi Kagaku Kogyo KK) having the thickness of 125 μm was laminated with a pair of surface layers 122 each consisting of a tetrafluoroethylene/ethylene copolymer sheet marketed under the tradename of Aflex film (Asahi Glass KK) having the thickness of 6 μm, and with a pair of copper foil layers 130 covering the outer surfaces of the corresponding surface layers 122 under the press condition of 280° C. of temperature, 30 minutes of press time, and 20 kg/cm² of press pressure (as illustrated in FIG. 16(d)).

Holes 160 (1.2 mm in diameter) for defining air gaps were drilled in the laminated assembly as illustrated in FIG. 16(e), and the copper foil 130 was entirely removed from both sides of the laminated assembly by etching to form a perforated inner insulating layer assembly as illustrated in FIG. 16(f).

The outer insulating layer assembly formed with electrostatic protective device circuit segments 150, the inner insulating layer assembly provided with holes 160 for defining air gaps, and another outer insulating layer assembly consisting of polytetrafluoroethylene resin film having one side thereof covered by copper foil 130 were laminated and bonded together under heated and pressurized condition (as illustrated in FIG. 16(g)). Holes 170 for interconnection were formed (as illustrated in FIG. 16(h)), plating was performed to the thickness of 15 μm (as indicated by numeral 180 in FIG. 16(i)), and terminals 190 for interconnection were formed by etching (as illustrated in FIGS. 160) and 16(k)).

Embodiment 12

Reference is made to FIGS. 17(a) to 17(h) illustrating different steps of fabricating an twelfth embodiment of the present invention. The parts corresponding to those of the previous embodiments are denoted with like numerals. First of all, extremely thin copper foil having the thickness of 5 μm was attached to one side of an outer insulating layer 123, and copper foil 130 having the thickness of 18 μm was attached to the other side of the insulating base board. The base material for this outer insulating layer 123 consisted of polytetrafluoroethylene resin prepreg reinforced by homemade glass cloth, and was laminated and pressed in combination with the extremely thin copper foil and the normal copper under the press condition of 380° C. of temperature, 90 minutes of press time, and 20 kg/cm² of press pressure.

Figure 17A:
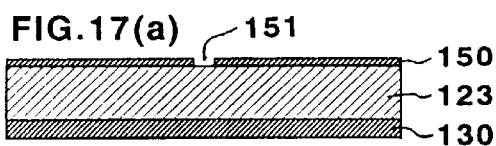
FIGS. 17(a) to 17(h) show different fabrication steps to illustrate the eleventh embodiment of the present invention, (a) and (c) to (h) being sectional views, (b) being a plan view showing the circuit patterns on the front surface of the base board at step (a).
Figure 17B:
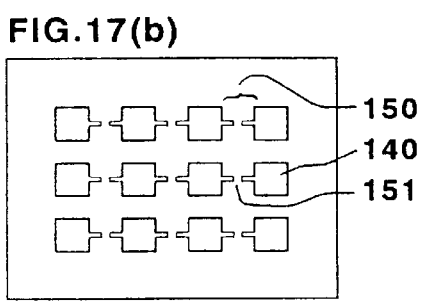

Sonne EDUV (tradename, Kansai Paint KK) consisting of resist for electro-deposition was deposited on this outer insulating layer assembly, and after a series of work including photographic exposure and development, a desired resist pattern was formed. The copper foil was then patterned so as to define electrostatic protective device circuit segments 150 by etching away the exposed part of the copper foil by spraying chemical etching liquid primarily consisting of ferric chloride solution as illustrated in FIG. 17(a). The pattern was defined such that a plurality of electrostatic protective device circuit segments 150 each including a terminal segments 140 for interconnection were arranged along the lateral direction in an alternating fashion, and this lateral row was repeated in the longitudinal direction in a parallel arrangement (as illustrated in FIG. 17(b)).

Figure 17C:
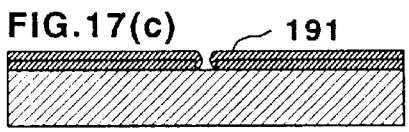

For the purpose of test, the etching condition (the composition, temperature and spraying pressure of the etching liquid, and the etching time) was controlled so that the discharge gaps be 100 μm, and electroless plating was performed on the discharge gaps and the circuit segments so as to obtain an outer insulator layer assembly having the discharge gaps of 30 μm and that having the discharge gaps of 50 μm. For the actual commercial production process, the etching condition was first roughly selected and, after the typical size of the gaps was measured, the time period for etching was determined according to the difference between the desired gap size and the actually measured gap size so that the precision of the gap size may be controlled by varying the plating time within a range that can be easily controlled (as illustrated in FIG. 17(c)).

Figure 17D:
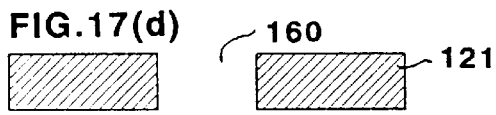

An inner insulating layer 121 consisting of polyimide film marketed under the tradename of Apical (Kanegahuchi Kagaku Kogyo KK) having the thickness of 125 μm was prepared, and holes 160 (1.4 mm in diameter) for defining air gaps were drilled in the inner insulating layer 121 (as illustrated in FIG. 17(d)).

Figure 17E:
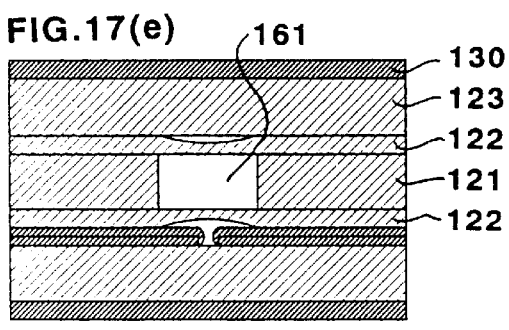

Another outer insulating layer assembly was prepared. The second outer insulating layer assembly comprises an outer insulating layer 123 consisting of polytetrafluoroethylene resin film, and copper foil 130 covering one side of this outer insulating layer 123. The first outer insulating layer assembly formed with electrostatic protective device circuit segments 150, the inner insulating layer assembly provided with holes 160 for defining air gaps, and the second outer insulating layer assembly were laminated and bonded under the press condition of 280° C. of temperature, 30 minutes of press time, and 20 kg/cm² of press pressure (as illustrated in FIG. 17(e)). A surface layer 122 consisting of a tetrafluoroethylene/ethylene copolymer sheet marketed under the tradename of Aflex film (Asahi Glass KK) and having the thickness of 6 μm was interposed in the interface between each adjacent pair of the assemblies.

Figure 17F:
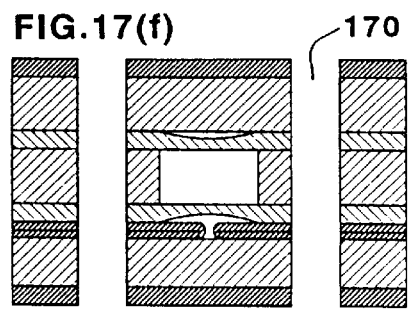
Figure 17G:
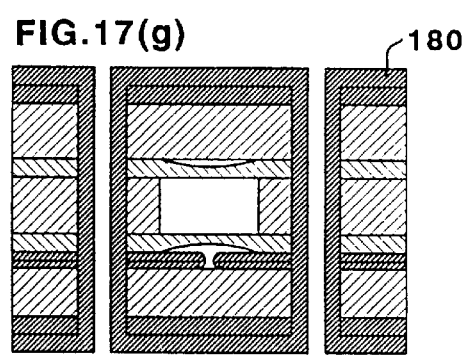
Figure 17H:
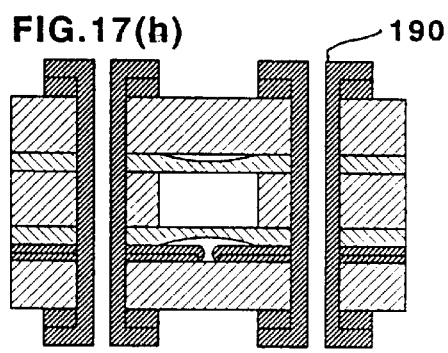

Holes 170 for interconnection were formed (as illustrated in FIG. 17(f)), plating was performed to the thickness of 15 μm (as indicated by numeral 180 in FIG. 17(g)), and terminals 190 for interconnection were formed by etching (as illustrated in FIG. 17(h)).

The assemblies prepared according to embodiments #11 and #12 were cut into individual chip type electrostatic protective devices, and the discharge voltage and the effectiveness in protecting IC's were evaluated for each of the devices. The discharge voltage levels were measured by applying a DC voltage.

The effectiveness in protecting IC's was evaluated by using a circuit as illustrated in FIG. 4 and testing the operation of the IC (IC:SN75189AN made by Texas Instruments) after applying ten electrostatic pulses of 10 kV (pulse internal: one second) produced by ESD8012 made by Sanki Denshi Kogyo KK (waveform: IEC801-2 standard) to the circuit.

The discharge voltage was 450 to 530 volts for those having the discharge gap of 30 μm (five devices for each of embodiments #11 and #12, or 10 devices in all), and 650 to 750 μm for those having the discharge gap of 50 μm (five devices for each of embodiments #11 and #12, or 10 devices in all). According to the conducted test, the IC's continued to operate satwasfactorily after the test for all of both embodiments #11 and #12.

Although the present invention has been described in terms of preferred embodiments thereof, it is obvious to a person skilled in the art that various alterations and modifications are possible without departing from the scope of the present invention which is set forth in the appended claims.

We claim:

1. A method for making a chip type electrostatic protective device comprising the steps of:
   preparing an inner insulating layer provided with through holes for defining air gaps;
   attaching a metallic layer to each side of said inner insulating layer provided with holes;
   forming a plurality of circuit segments on each side of said insulating layer by etching away unnecessary parts of said metallic layers from said insulating layer;
   laminating and bonding an outer insulating layer and metallic foil to each side of an assembly of said inner insulating layer and said circuit segments;
   forming through holes for interconnection in an assembly prepared by the preceding step between said air gap holes;
   forming terminal segments for interconnection around said holes for interconnection by selectively etching said metallic foil;
   forming an electroconductive layer on an inner wall of said holes for interconnection; and
   cutting apart an assembly prepared by the preceding step into individual chip type electrostatic protective devices by cutting through each of said holes for interconnection so as to define a terminal for interconnection with a cut apart half of each of said holes for interconnection.

2. A method for making a chip type electrostatic protective device according to claim 1, wherein at least a part of said inner insulating layer consists of a material selected from a fluoride resin material and a polyimide resin material.

3. A chip type electrostatic protective device according to claim 2, wherein said part of said inner insulating layer consists of a fluoride resin material selected from a group consisting of polytetrafluoroethylene resin, ethylene/tetrafluoroethylene copolymer, tetrafluoroethylene/hexafluoropropylene copolymer, tetrafluoroethylene/perfluoroalkoxypropylene copolymer, and a modified resin prepared by modifying a fluoride resin with a different organic resin.

4. A method for making a chip type electrostatic protective device according to claim 1, wherein said inner insulating layer is provided with a surface layer having a thickness ranging from 5 to 30 μm and made of a material having a lower softening point than the remaining part of said inner insulating material.

5. A method for making a chip type electrostatic protective device according to claim 4, wherein said surface layer of said inner insulating layer consists of ethylene/tetrafluoroethylene copolymer, and the remaining material consists of polytetrafluoroethylene resin.

6. A chip type electrostatic protective device according to claim 1, wherein said air gaps are spaced from each other by a distance ranging from 15 to 150 μm.

7. A chip type electrostatic protective device according to claim 6, wherein said air gaps are spaced from each other by a distance ranging from 15 to 60 μm.

8. A chip type electrostatic protective device according to claim 7, wherein said air gaps are spaced from each other by a distance ranging from 15 to 30 μm.

9. A chip type electrostatic protective device according to claim 1, wherein said metallic layers for defining said circuit segments consists of metallic foil.

10. A chip type electrostatic protective device according to claim 1, wherein said metallic layers for defining said circuit segments consists of gas phase or liquid phase plating.

11. A chip type electrostatic protective device according to claim 1, wherein said holes for interconnection is made electroconductive by electroless plating.

12. A method for making a chip type electrostatic protective device comprising the steps of:
    preparing a laminated assembly comprising a pair of metallic layers interposing an inner insulating layer therebetween;
    forming a plurality of through holes for defining air gaps in said laminated assembly;
    forming circuit segments by selectively removing said metallic layers by etching, each of said circuit segments including a part surrounding one of said air gap holes;
    laminating and bonding an outer insulating layer and metallic foil to each side of an assembly of said inner insulating layer and said circuit segments;
    forming through holes for interconnection in an assembly prepared by the preceding step between said air gap holes;
    forming terminal portions for interconnection around said holes for interconnection by selectively etching said metallic foil;
    forming an electroconductive layer on an inner wall of said holes for interconnection; and
    cutting apart an assembly prepared by the preceding step into individual chip type electrostatic protective devices by cutting through each of said holes for interconnection so as to define a terminal for interconnection with a cut apart half of each of said holes for interconnection.

13. A method for making a chip type electrostatic protective device according to claim 12, further comprising the step of applying plating to an edge of each of said circuit segments exposed in a corresponding one of said air gap holes so as to project said edge into said air gap hole by a prescribed height.

14. A method for making a chip type electrostatic protective device comprising the steps of:

preparing a laminated assembly comprising a pair of metallic layers interposing an inner insulating layer therebetween;

forming circuit segments by selectively removing said metallic layers by etching;

laminating an intermediate insulating layer on each side of an assembly prepared by the preceding step;

forming a plurality of through holes for defining air gaps in said laminated assembly, each of said air gap holes passing through one of said circuit segments;

laminating and bonding an outer insulating layer and metallic foil to each side of an assembly of said inner insulating layer, said circuit segments, and said intermediate insulating layer;

forming through holes for interconnection in an assembly prepared by the preceding step between said air gap holes;

forming terminal portions for interconnection around said holes for interconnection by selectively etching said metallic foil;

forming an electroconductive layer on an inner wall of said holes for interconnection; and cutting apart an assembly prepared by the preceding step into individual chip type electrostatic protective devices by cutting through each of said holes for interconnection so as to define a terminal for interconnection with a cut apart half of each of said holes for interconnection.

15. A method for making a chip type electrostatic protective device comprising the steps of:

preparing a first outer insulating layer having a metallic layer on each side thereof, at least one of said metallic layers having a thickness ranging from 3 to 10 $\mu$m;

forming a plurality of circuit segments on said first outer insulating layer by etching away unnecessary parts of said one metallic layer from said first outer insulating layer, each associated pair of said circuit segments being provided with mutually opposing edges in said air gap hole;

preparing an inner insulating layer provided with a plurality of holes for defining air gaps;

laminating and bonding said inner insulating layer between said first outer insulating layer, and a second outer insulating layer having a metallic layer formed on one side thereof, with the other metallic layer of said first outer insulating layer and said metallic layer formed on one side of said second outer insulating layer facing away from each other;

forming through holes for interconnection in an assembly prepared by the preceding step between said air gap holes;

forming terminal portions for interconnection around said holes for interconnection by selectively etching said metallic foil;

forming an electroconductive layer on an inner wall of said holes for interconnection; and cutting apart an assembly prepared by the preceding step into individual chip type electrostatic protective devices by cutting through each of said holes for interconnection so as to define a terminal for interconnection with a cut apart half of each of said holes for interconnection.

16. A method for making a chip type electrostatic protective device according to claim 15, wherein said metallic layers having a thickness ranging from 3 to 10 $\mu$m, and formed on said first outer insulating layer is prepared by the steps of;

laminating a composite metallic layer including a first copper layer having a thickness ranging from 10 to 50 $\mu$m, an intermediate layer made of nickel or an alloy thereof having a thickness less than 1 $\mu$m, and a second copper layer having a thickness ranging from 3 to 10 $\mu$m to said first outer insulating layer, with said second copper layer facing said first outer insulating layer;

removing said first copper layer; and removing said intermediate layer until said second copper layer is exposed.

17. A method for making a chip type electrostatic protective device according to claim 16, wherein said first copper layer is left unremoved in parts adjoining points of connection with said through holes for interconnection.

18. A method for making a chip type electrostatic protective device according to claim 15, further comprising the step of applying a controlled amount of protective plating to said circuit segments before said laminating and bonding step.

19. A method for making a chip type electrostatic protective device comprising the steps of:

preparing a pair of circuit segment assemblies each of which comprises an outer insulating layer, a first metallic layer covering one side of said outer insulating layer, and a second metallic layer cover the other side of said outer insulating layer;

forming a plurality of circuit segments on one side of said outer insulating layer by etching away unnecessary parts of said first metallic layer;

preparing an inner insulating layer formed with a plurality of through holes for defining gap in association with said circuit segments;

laminating and bonding said inner insulating layer between said circuit segment layers with said circuit segments of said circuit segment assembly facing said inner insulating layer and each of said circuit segments aligned with an associated on of said air gap holes of said inner insulating layer;

forming through holes for interconnection in an assembly prepared by the preceding step between said air gap holes;

forming terminal portions for interconnection around said holes for interconnection by selectively etching said second metallic layers;

forming an electroconductive layer on an inner wall of said holes for interconnection; and cutting apart an assembly prepared by the preceding step into individual chip type electrostatic protective devices by cutting through each of said holes for interconnection so as to define a terminal for interconnection with a cut apart half of each of said holes for interconnection.

20. A method for making a chip type electrostatic protective device comprising the steps of:

preparing a pair of circuit segment assemblies each of which comprises an outer insulating layer, a metallic layer covering one side of said outer insulating layer;

forming a plurality of circuit segments on said one side of said outer insulating layer by etching away unnecessary parts of said metallic layer;

preparing an inner insulating layer;

laminating and bonding said inner insulating layer between said circuit segment layers with said circuit segments of said circuit segment assembly facing said inner insulating layer;

forming through holes for defining air gaps in an assembly prepared by the preceding step, each of said air gap holes passing through one of said circuit segments;

preparing a pair of interconnection terminal assemblies each of which comprises an outer insulating layer, and a metallic foil layer covering one side of said outer insulating layer;

laminating and bonding an assembly including said inner insulating layer and said circuit segment layers between said interconnection terminal assemblies with said metallic foil layers of said interconnection terminal assemblies facing away from each other;

forming through holes for interconnection in an assembly prepared by the preceding step between said air gap holes;

forming terminal portions for interconnection around said holes for interconnection by selectively etching said second metallic foil layers;

forming an electroconductive layer on an inner wall of said holes for interconnection; and cutting apart an assembly prepared by the preceding step into individual chip type electrostatic protective devices by cutting through each of said holes for interconnection so as to define a terminal for interconnection with a cut apart half of each of said holes for interconnection.

* * * * *